US007904845B2

(12) United States Patent
Fouquet et al.

(10) Patent No.: US 7,904,845 B2
(45) Date of Patent: Mar. 8, 2011

(54) DETERMINING LOCATIONS ON A WAFER TO BE REVIEWED DURING DEFECT REVIEW

(75) Inventors: Christophe Fouquet, Sunnyvale, CA (US); Gordon Abbott, Pleasanton, CA (US); Ellis Chang, Saratoga, CA (US); Zain K. Saidin, San Mateo, CA (US)

(73) Assignee: KLA-Tencor Corp., San Jose, CA (US)

( * ) Notice: Subject to any disclaimer, the term of this patent is extended or adjusted under 35 U.S.C. 154(b) by 452 days.

(21) Appl. No.: 11/950,961

(22) Filed: Dec. 5, 2007

(65) Prior Publication Data

US 2008/0163140 A1 Jul. 3, 2008

Related U.S. Application Data

(60) Provisional application No. 60/868,769, filed on Dec. 6, 2006.

(51) Int. Cl.
*G06F 17/50* (2006.01)
(52) U.S. Cl. ............ 716/4; 716/5; 702/81; 702/82; 702/83; 702/108; 702/109; 702/117; 702/118; 324/765
(58) Field of Classification Search .......... 716/4–5; 702/81–84, 108–109, 117–121, 127–129, 702/179–185; 324/765
See application file for complete search history.

(56) References Cited

U.S. PATENT DOCUMENTS

| | | | |
|---|---|---|---|
| 6,020,957 A | 2/2000 | Rosengaus et al. | |
| 6,222,936 B1 * | 4/2001 | Phan et al. | 382/149 |
| 6,407,373 B1 | 6/2002 | Dotan | |
| 6,696,679 B1 | 2/2004 | Graef et al. | |
| 6,701,259 B2 * | 3/2004 | Dor et al. | 702/35 |
| 6,829,559 B2 | 12/2004 | Bultman et al. | |
| 6,880,136 B2 * | 4/2005 | Huisman et al. | 716/4 |
| 6,902,855 B2 | 6/2005 | Peterson et al. | |
| 7,027,143 B1 | 4/2006 | Stokowski et al. | |
| 7,077,556 B2 | 7/2006 | Sugiura | |
| 7,123,356 B1 | 10/2006 | Stokowski et al. | |
| 7,570,796 B2 * | 8/2009 | Zafar et al. | 382/144 |
| 2004/0091142 A1 | 5/2004 | Peterson et al. | |
| 2005/0004774 A1 * | 1/2005 | Volk et al. | 702/108 |
| 2005/0221229 A1 | 10/2005 | Nasser-Ghodsi et al. | |
| 2006/0051682 A1 | 3/2006 | Hess et al. | |
| 2006/0062445 A1 | 3/2006 | Verma et al. | |
| 2006/0082763 A1 | 4/2006 | Teh et al. | |
| 2006/0133661 A1 | 6/2006 | Takeda et al. | |
| 2006/0236294 A1 | 10/2006 | Saidin et al. | |
| 2006/0291714 A1 | 12/2006 | Wu et al. | |
| 2007/0035728 A1 | 2/2007 | Kekare et al. | |
| 2007/0156379 A1 | 7/2007 | Kulkarni et al. | |
| 2007/0288219 A1 * | 12/2007 | Zafar et al. | 703/14 |

OTHER PUBLICATIONS

International Search Report and Written Opinion for PCT/US07/86635 filed on Dec. 6, 2007. U.S. Appl. No. 11/561,659, filed Nov. 20, 2006, Zafar et al.
U.S. Appl. No. 60/916,915, filed May 9, 2007, Peterson et al.
U.S. Appl. No. 60/974,030, filed Sep. 20, 2007, Bhaskar et al.

* cited by examiner

*Primary Examiner* — Nghia M Doan
(74) *Attorney, Agent, or Firm* — Ann Marie Mewherter

(57) ABSTRACT

Various methods, designs, defect review tools, and systems for determining locations on a wafer to be reviewed during defect review are provided. One computer-implemented method includes acquiring coordinates of defects detected by two or more inspection systems. The defects do not include defects detected on the wafer. The method also includes determining coordinates of the locations on the wafer to be reviewed during the defect review by translating the coordinates of the defects into the coordinates on the wafer such that results of the defect review performed at the locations can be used to determine if the defects cause systematic defects on the wafer.

24 Claims, 12 Drawing Sheets

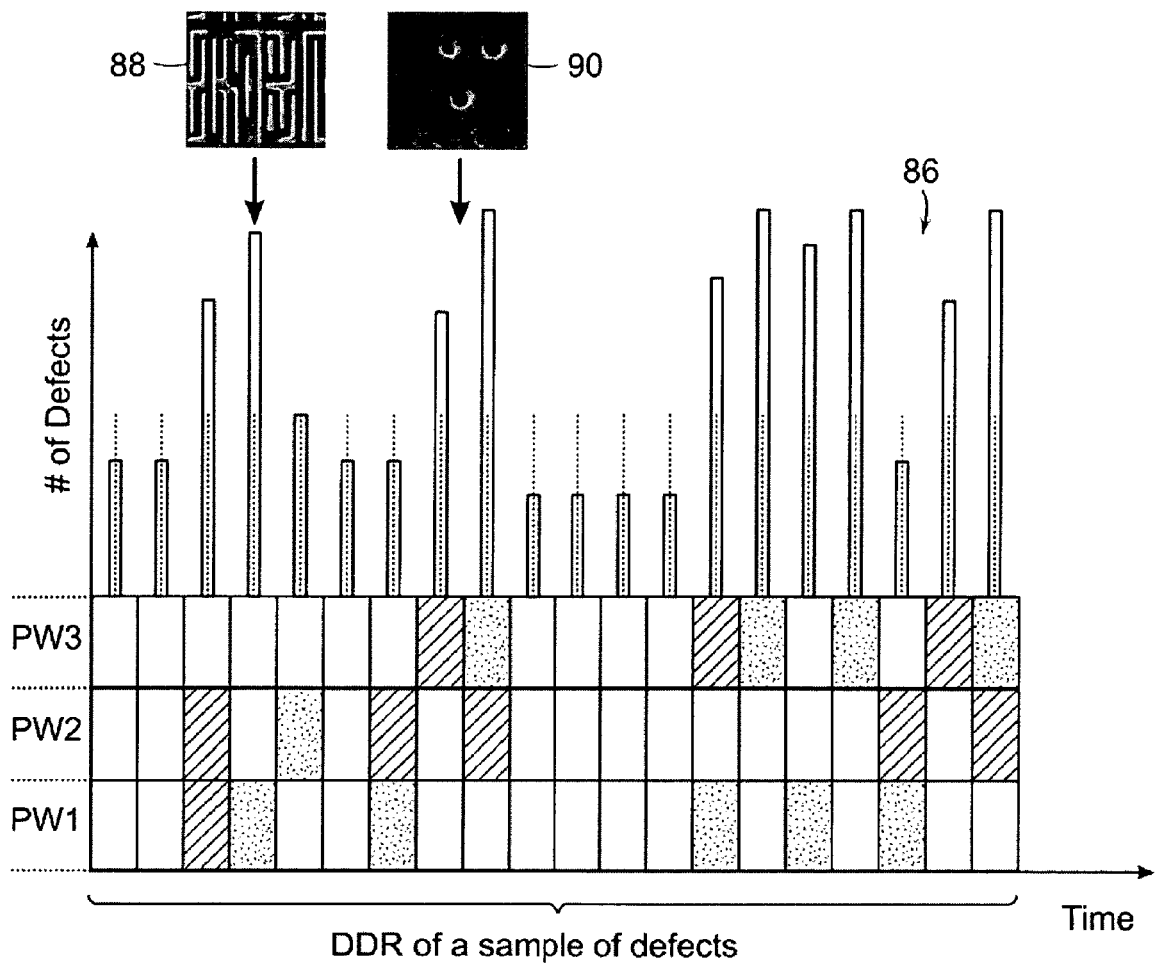
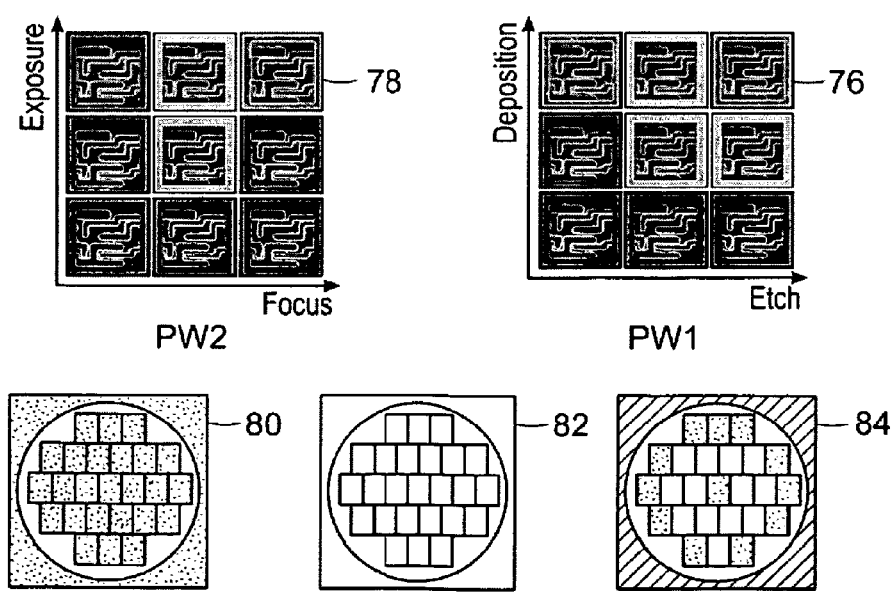
FIG. 4

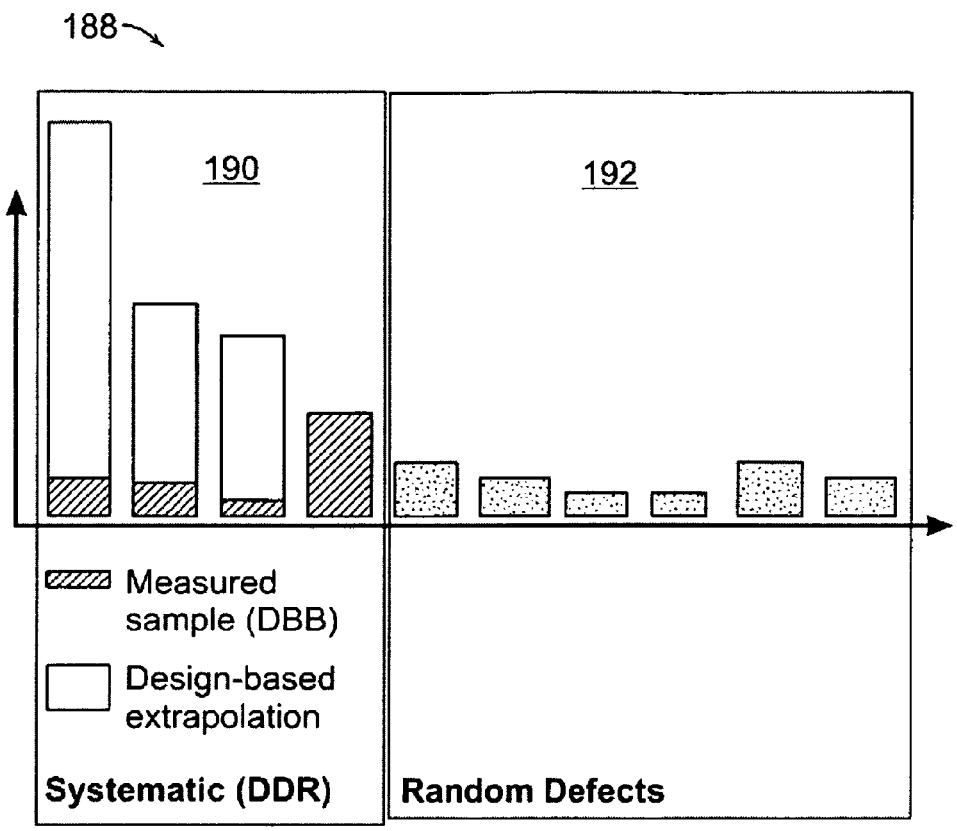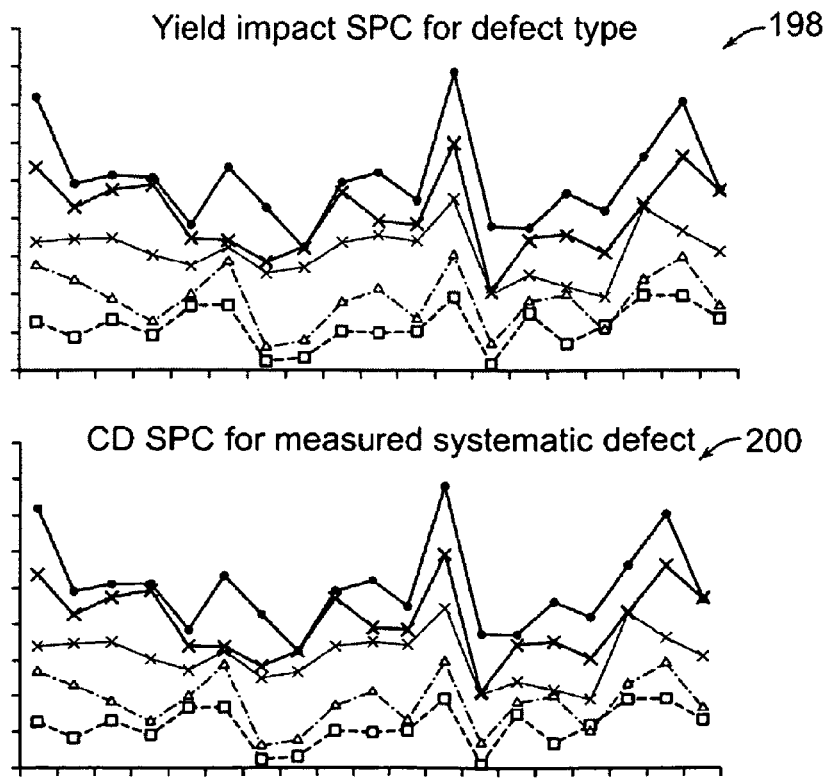
FIG. 9

DETERMINING LOCATIONS ON A WAFER TO BE REVIEWED DURING DEFECT REVIEW

PRIORITY CLAIM

This application claims priority to U.S. Provisional Application No. 60/868,769 entitled "Methods, Designs, Defect Review Tools, and Systems for Locating Systematic Defects in a Defect Review Process," filed Dec. 6, 2006, which is incorporated by reference as if fully set forth herein.

BACKGROUND OF THE INVENTION

1. Field of the Invention

The present invention generally relates to methods, designs, defect review tools, and systems for determining locations on a wafer to be reviewed during defect review. Certain embodiments relate to a computer-implemented method that includes translating coordinates of defects, which do not include defects detected on a wafer, into coordinates of locations on the wafer to be reviewed during defect review such that results of the defect review performed at the locations can be used to determine if the defects cause systematic defects on the wafer.

2. Description of the Related Art

The following description and examples are not admitted to be prior art by virtue of their inclusion in this section.

An integrated circuit (IC) design may be developed using a method or system such as electronic design automation (EDA), computer aided design (CAD), and other IC design software. Such methods and systems may be used to generate a circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

The term "design data" as used herein generally refers to the physical design (layout) of an IC and data derived from the physical design through complex simulation or simple geometric and Boolean operations. The design data may include not only layout information, but electrical and material design information as well. Basically, design data may include any design information that is used in the creation of a "device."

A semiconductor device design is verified by different procedures before production of ICs. For example, the semiconductor device design is checked by software simulation to verify that all features will be printed correctly after lithography in manufacturing. Such checking commonly includes steps such as design rule checking (DRC), optical rule checking (ORC), and more sophisticated software-based verification approaches that include process simulation calibrated to a specific fab and process. The output of the physical design verification steps can be used to identify a potentially large number of critical points, sometimes referred to as "hot spots," in the design.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

Another important part of manufacturing yield control is determining the cause of defects on wafers such that the cause of the defects can be corrected to thereby reduce the number of defects on other wafers. Often, determining the cause of defects involves identifying the defect type and other attributes of the defects such as size, shape, composition, etc. Since inspection typically only involves detecting defects on wafers and providing limited information about the defects such as location on the wafers, number of defects on the wafers, and sometimes defect size, defect review is often used to determine more information about individual defects than that which can be determined from inspection results. For instance, a defect review tool may be used to revisit defects detected on a wafer and to examine the defects further in some manner either automatically or manually.

Defect review typically involves generating additional information about defects at a higher resolution using either a high magnification optical system or a scanning electron microscope (SEM). The higher resolution data for the defects generated by defect review is more suitable for determining attributes of the defects such as profile, roughness, more accurate size information, etc. Defect analysis may also be performed using a system such as an electron dispersive x-ray spectroscopy (EDS) system. Such defect analysis may be performed to determine information such as composition of the defects. Attributes of the defects determined by inspection, review, analysis, or some combination thereof can be used to identify the type of the defect (i.e., defect classification) and possibly a root cause of the defects. This information can then be used to monitor and alter one or more parameters of one or more semiconductor fabrication processes to reduce or eliminate the defects.

As design rules shrink, however, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive. As such, determining which of the defects actually have an effect on the electrical parameters of the devices and the yield may allow process control methods to be focused on those defects while largely ignoring others. Furthermore, at smaller design rules, process induced failures may, in some cases, tend to be systematic. That is, process induced failures tend to fail at predetermined design patterns often repeated many times within the design. Elimination of spatially systematic, electrically relevant defects is important because eliminating such defects can have a significant overall impact on yield.

Accordingly, it may be advantageous to develop methods, designs, defect review tools, and systems for determining locations on a wafer to be reviewed during defect review such that results of the defect review can be used to determine if defects in a design and/or on a reticle cause systematic defects on the wafer.

SUMMARY OF THE INVENTION

The following description of various embodiments of methods, carrier media, and systems is not to be construed in any way as limiting the subject matter of the appended claims.

One embodiment relates to a computer-implemented method for determining locations on a wafer to be reviewed during defect review. The method includes acquiring coordinates of defects detected by two or more inspection systems. The defects do not include defects detected on the wafer. The method also includes determining coordinates of the locations on the wafer to be reviewed during the defect review by translating the coordinates of the defects into the coordinates on the wafer such that results of the defect review performed at the locations can be used to determine if the defects cause systematic defects on the wafer.

In one embodiment, the defects include defects in a design, defects detected on a reticle, defects on the reticle detected by process window characterization, or some combination thereof, and the two or more inspection systems include a design inspection system, a reticle inspection system, a process window characterization system, or some combination thereof.

In one embodiment, determining the coordinates includes determining the coordinates of the locations on the wafer to be reviewed as a single set of coordinates. In another embodiment, the method includes creating a recipe for the defect review using the coordinates of the locations and a design for the wafer. In one such embodiment, creating the recipe is performed offline without imaging of the wafer or defects on the wafer.

In some embodiments, the method includes determining if systematic defects detected on the wafer by inspection of the wafer are correlated to the defects detected by the two or more inspection systems. In another embodiment, the method includes creating an encrypted and secured file that includes the coordinates of the locations on the wafer to be reviewed during the defect review.

In one embodiment, the method includes identifying the locations on the wafer during the defect review by comparing images acquired during the defect review at the coordinates of the locations to a design for the wafer. In another embodiment, the method includes selecting a method for automatic defect location to be performed during the defect review from all available methods for the automatic defect location based on a design for the wafer. In an additional embodiment, the method includes identifying the locations on the wafer during the defect review by comparing images acquired during the defect review at the coordinates of the locations to a design for the wafer and simulated images that illustrate how the design would be printed on the wafer at different values of one or more parameters of a process performed on the wafer. In one such embodiment, the method includes determining information about the process based on results of the comparing step.

In one embodiment, the method includes determining, during the defect review, if additional locations on the wafer are to be reviewed based on results of the defect review at the locations and a design for the wafer proximate the locations. In another embodiment, the method includes determining, during the defect review, if an additional operation is to be performed at the locations on the wafer based on results of the defect review at the locations and a design for the wafer.

In one embodiment, the method includes acquiring results of inspection of the wafer and randomly selecting defects detected by the inspection of the wafer from the results of the inspection for review during the defect review. The locations on the wafer constitute a systematic defect sample, and the randomly selected defects constitute a random sample. The defect review for the systematic defect sample and the random sample is performed in the same defect review process.

In one such embodiment, prior to the defect review, if analysis of the results of the inspection indicates that one or more of the defects detected by the inspection of the wafer are systematic defects, the method includes adding the one or more of the defects to the systematic defect sample and if the one or more of the defects are included in the random sample, removing the one or more of the defects from the random sample. In another such embodiment, the method includes generating a Pareto chart illustrating results of the defect review of the systematic defect sample and the random sample. In an additional such embodiment, the method includes classifying defects in the random sample identified by the defect review as systematic defects using design-based binning.

In one embodiment, the method includes using results of the defect review to determine locations of the systematic defects on the wafer and using a design for the wafer to determine additional locations on the wafer at which the systematic defects can be found. In another embodiment, the method includes using results of the defect review to determine a kill ratio for defects found during the defect review by comparing the found defects to a design for the wafer and to determine a yield impact for the defects found during the defect review by comparing dimensions of the defects found during the defect review to dimensions of the design.

In one embodiment, the method includes altering one or more parameters of at least one of the two or more inspection systems based on results of the defect review. In another embodiment, the method includes storing information about the defects detected by the two or more inspection systems and results of the defect review in a database for systematic defects.

In one embodiment, the method includes using information about the defects detected by the two or more inspection systems and results of the defect review to generate a design for a test object. The design includes all designs that can be used for monitoring a process performed on the wafer. In another embodiment, the method includes using information about the defects detected by the two or more inspection systems and results of the defect review to generate a design for a test structure configured to be monitored for systematic defects and to add the design to a design to be printed on product wafers. In an additional embodiment, the method includes using information about the defects detected by the two or more inspection systems and results of the defect review to generate a design for a monitor wafer configured to be monitored for systematic defects after processing of the monitor wafer with product wafers. The design includes critical designs for the product wafers and variations of the critical designs corresponding to process windows for the critical designs.

Each of the steps of each of the embodiments of the method described above may be further performed as described further herein. In addition, each of the embodiments of the method described above may include any other step(s) of any other method(s) described herein. Furthermore, each of the embodiments of the method described above may be performed by any of the systems described herein.

Another embodiment relates to a carrier medium that includes program instructions executable on a computer system for performing a computer-implemented method for determining locations on a wafer to be reviewed during defect review. The computer-implemented method includes acquiring coordinates of defects detected by two or more inspection systems. The defects do not include defects detected on the wafer. The method also includes determining coordinates of the locations on the wafer to be reviewed during the defect review by translating the coordinates of the defects into the coordinates on the wafer such that results of the defect review performed at the locations can be used to determine if the defects cause systematic defects on the wafer.

The carrier medium described above may be further configured as described herein. The steps of the computer-implemented method may be performed as described further herein. In addition, the computer-implemented method for which the program instructions are executable may include any other step(s) of any other method(s) described herein.

An additional embodiment relates to a system configured to determine locations on a wafer to be reviewed during defect review. The system includes two or more inspection systems configured to detect defects. The defects do not include defects detected on the wafer. The system also includes a computer system coupled to the two or more inspection systems such that the computer system can acquire coordinates of the defects detected by the two or more inspection systems. The computer system is configured to determine coordinates of the locations on the wafer to be reviewed during the defect review by translating the coordinates of the defects into the coordinates on the wafer such that results of the defect review performed at the locations can be used to determine if the defects cause systematic defects on the wafer. The embodiment of the system described above may be further configured as described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which:

FIGS. 3-4 are schematic diagrams illustrating applications for which the embodiments described herein are particularly useful;

FIG. 9 includes examples of embodiments of charts that may be generated by the embodiments described herein;

Figure 1:
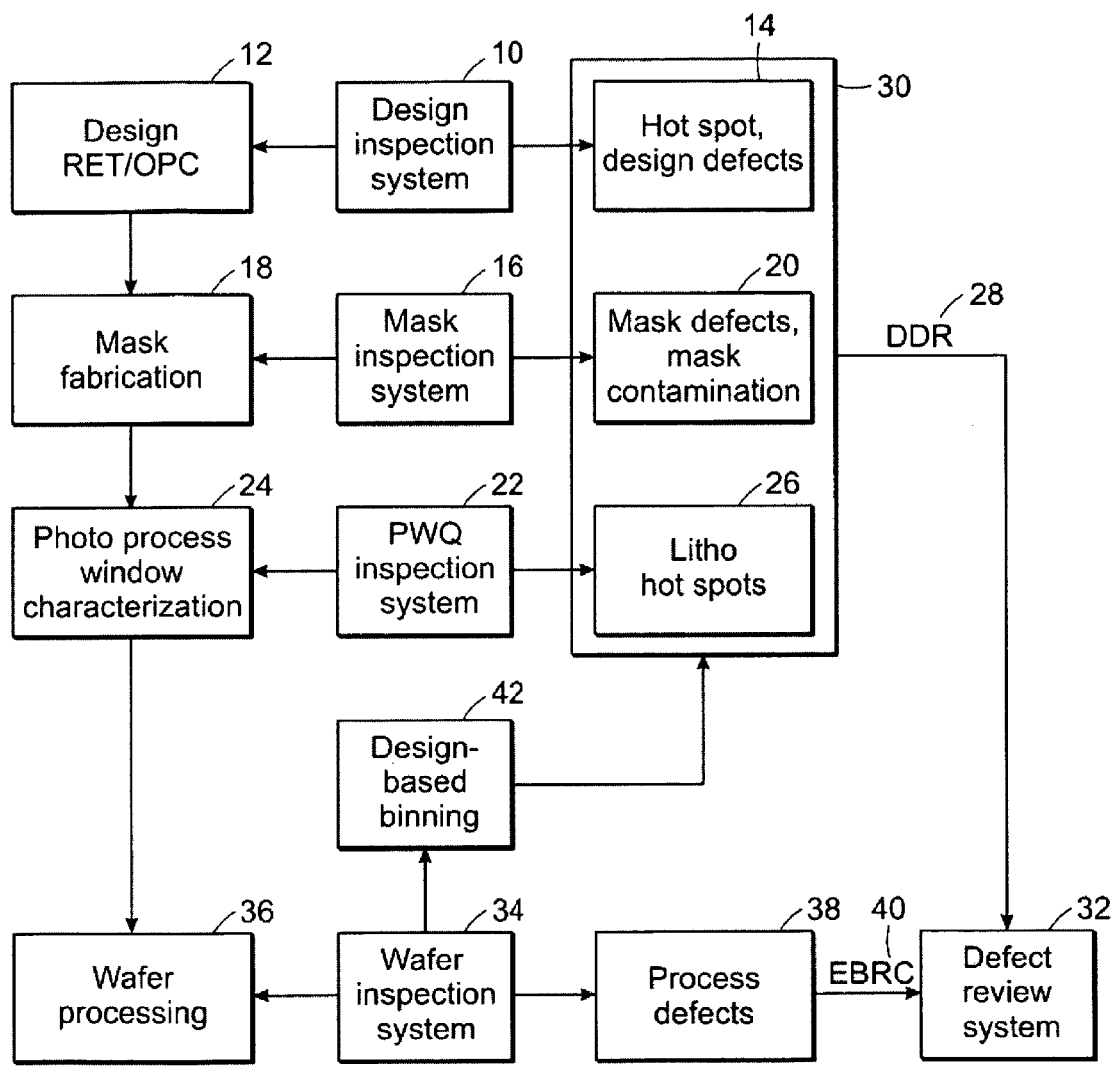
FIG. 1 is a flow chart illustrating one embodiment of a computer-implemented method for determining locations on a wafer to be reviewed during defect review.

While the invention is susceptible to various modifications and alternative forms, specific embodiments thereof are shown by way of example in the drawings and may herein be described in detail. The drawings may not be to scale. It should be understood however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices such as integrated circuits (ICs) may be formed on a wafer, and the term wafer as used herein is intended to encompass a wafer on which any type of device known in the art is being fabricated.

The terms "reticle" and "mask" are used interchangeably herein. A reticle generally includes a transparent substrate such as glass, borosilicate glass, and fused silica having patterned regions of opaque material formed thereon. The opaque regions may be replaced by regions etched into the transparent substrate. Many different types of reticles are known in the art, and the term reticle as used herein is intended to encompass all types of reticles.

The term "design" as used herein generally refers to the physical design (layout) of an IC and data derived from the physical design through complex simulation or simple geometric and Boolean operations. The design may include not only layout information, but electrical and material design information as well. Basically, the design may include any design information that is used in the creation of a "device." In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. patent application Ser. Nos. 11/561,735 by Kulkarni et al., published as U.S. Patent Application Publication No. 2007/0156379 on Jul. 5, 2007, and 11/561,659 by Zafar et al., both of which were filed on Nov. 20, 2006 and which are incorporated by reference as if fully set forth herein.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

One embodiment relates to a computer-implemented method for determining locations on a wafer to be reviewed during defect review. The method includes acquiring coordinates of defects detected by two or more inspection systems. The defects do not include defects detected on the wafer. Acquiring the coordinates of the defects may include requesting the coordinates or data structure(s) such as file(s) containing the coordinates from the two or more inspection systems or other system(s) in which the two or more inspection systems stored data structure(s) containing the coordinates of the defects. Acquiring the coordinates of the defects may also or alternatively include retrieving the coordinates or data structure(s) such as file(s) containing the coordinates from one or more storage media in which the coordinates or the data structure(s) were stored (e.g., by the inspection systems). The one or more storage media may include individual storage media of the two or more inspection systems or one or more other storage media coupled to the two or more inspection systems (e.g., one or more fab databases).

In this manner, a system configured to perform the computer-implemented method may be connected to the two or more inspection systems, other system(s), or one or more storage media in a manner such that the system can acquire the coordinates of the defects. The system configured to perform the computer-implemented method may be connected to the two or more inspection systems in any suitable manner (e.g., by one or more transmission media that serve as data link(s) across which the system can receive the coordinates of the defects). Therefore, as described further herein, the unique value of various inspection systems and the output of the inspection systems may be extended to systematic defect review by extending the connectivity of the inspection systems.

In one embodiment, the defects include defects in a design, defects detected on a reticle, defects on the reticle detected by process window characterization, or some combination thereof, and the two or more inspection systems include a design inspection system, a reticle inspection system, a process window characterization system, or some combination thereof. As such, the two or more inspection systems include inspection systems that are configured to detect defects that may produce systematic defects on a wafer. Therefore, the embodiments described herein may have connectivity to systematic defect inspection systems (such as reticle, design, and lithography inspection systems). In this manner, during various phases in a fabrication process, different inspection systems may be used to detect different potential sources of systematic defects, and the results of the different inspection systems are combined to determine locations on a wafer at which systematic defects may be located.

In particular, at the design phase, resolution enhancement technology (RET) features such as optical proximity correction (OPC) features may be added to the design, and a design inspection system may be used to inspect the "decorated" design. Output of the design inspection system may include, for example, hot spots and design defects. For example, as shown in FIG. 1, design inspection system 10 may be configured to inspect design 12, which may include RET features such as OPC features. Design 12 may have any suitable form known in the art. For example, the design may be stored in a graphical data stream (GDS) file, any other standard machine-readable file, any other suitable file known in the art, or a design database. The term "GDS" as used herein generally refers to the geometrical design layout information and can be any representation of that data. Such a representation will commonly be in either GDSII or OASIS format, but may alternatively be in any other suitable representation. For example, a GDSII file is one of a class of files used for the representation of design layout data. Other examples of such files include GL1 and OASIS files. All such representations may be used in the embodiments as described herein with respect to GDS and GDSII.

The design inspection system may include any suitable design inspection system known in the art. Examples of methods and systems for design inspection are illustrated in commonly owned U.S. patent application Ser. Nos. 11/003,291 by Hess et al. filed Dec. 3, 2004, which published as U.S. Patent Application Publication No. 2006/0051682 on Mar. 9, 2006, 11/048,630 by Saidin et al. filed Jan. 31, 2005, which published as U.S. Patent Application Publication No. 2006/0236294 on Oct. 19, 2006, and 11/226,698 by Verma et al. filed Sep. 14, 2005, which published as U.S. Patent Application Publication No. 2006/0062445 on Mar. 23, 2006, all of which are incorporated by reference as if fully set forth herein. The embodiments described herein may include or be configured to perform any step(s) of any method(s) described in these patent applications. Results 14 of design inspection performed by design inspection system 10 may include hot spots, design defects, and other results of design inspection known in the art.

During the mask fabrication phase, a mask inspection system may be used to inspect the fabricated mask. Output of the mask inspection system may include reticle defects and reticle contamination. For example, as shown in FIG. 1, mask inspection system 16 may be configured to detect defects on a mask fabricated by mask fabrication 18. Mask fabrication may include any suitable mask manufacturing processes known in the art. The mask inspection system may include any suitable mask inspection system. For example, the mask inspection system may be a commercially available mask inspection system such as the STARlight, STARlight-2, and TeraScan systems that are commercially available from KLA-Tencor, San Jose, Calif. Additional examples of mask inspection systems are described in commonly owned U.S. Pat. Nos. 7,027,143 to Stokowski et al. and 7,123,356 to Stokowski et al. and commonly owned U.S. patent application Ser. No. 10/679,671 by Stokowski et al. filed Oct. 6, 2003, all of which are incorporated by reference as if fully set forth herein. Mask inspection system 16 may be configured as described in these patents and this patent application. Results 20 generated by the mask inspection system may include but are not limited to, mask defects and mask contamination.

During the photo or lithography process window characterization phase, a process window qualification (PWQ) inspection system may be used to characterize the process window that can be used with the fabricated mask. Output of the PWQ system may include lithography hot spots. For example, as shown in FIG. 1, PWQ inspection system 22 may be configured to perform photo process window characterization 24 using the fabricated mask. The PWQ inspection system may be configured to perform PWQ or photo process window characterization as described in commonly owned U.S. Pat. No. 6,902,855 to Peterson et al. and commonly owned U.S. patent application Ser. Nos. 10/619,943 by Peterson et al. filed Jul. 15, 2003, which published as U.S. Patent Application Publication No. 2004/0091142 on May 13, 2004, 11/005,658 by Wu et al. filed Dec. 7, 2004, which published as U.S. Patent Application Publication No. 2006/0291714 on Dec. 28, 2006, 11/314,813 by Kekare et al. filed Dec. 20, 2005, which published as U.S. Patent Application Publication No. 2007/0035728 on Feb. 15, 2007, and 60/916,915 by Peterson et al. filed May 9, 2007, all of which are incorporated by reference as if fully set forth herein. The embodiments described herein may include or be configured to perform any step(s) of any method(s) described in this patent and these patent applications. Results 26 generated by PWQ inspection system 22 may include litho hot spots.

The computer-implemented method also includes determining coordinates of the locations on the wafer to be reviewed during the defect review by translating the coordinates of the defects into the coordinates on the wafer such that results of the defect review performed at the locations can be used to determine if the defects cause systematic defects on the wafer. Determining the coordinates of the locations on the wafer to be reviewed may include translating reticle defect coordinates, design defect coordinates, photo (lithography) defect coordinates, or some combination thereof into wafer coordinates for review. For example, as shown in FIG. 1, results 14, 20, and 26 may be used in combination to determine the coordinates of locations to be reviewed during discrete defect review (DDR) 28 for systematic defects. More specifically, the method may include translating coordinates of hot spots and design defects in results 14, coordinates of mask defects and mask contamination in results 20, and coordinates of litho hot spots in results 26 to coordinates of locations on the wafer to be reviewed during the defect review. Translating the coordinates may be performed based on the coordinates reported by the two or more inspection systems and additional information such as the layout of the design on the wafer and/or the layout in which the reticle will be printed on the wafer. In this manner, the method may include translating coordinates determined in a space other than wafer space into coordinates in wafer space. In addition, translating the coordinates may include translating coordinates reported by the two or more inspection systems into coordinates in a format useable by the defect review system. Such translation of coordinates may be further performed as described in the above-referenced patent applications by Kulkarni et al. and Zafar et al.

In one embodiment, determining the coordinates includes determining the coordinates of the locations on the wafer to be reviewed as a single set of coordinates. For example, determining the coordinates may include combining several sources of defect coordinates (e.g., in results 14, 20, and 26) into one single source of defect coordinates 30 that will constitute the sample for the defect review. Determining the coordinates may include using one file or multiple files generated by the sources to combine the defect coordinates into one single source of defect coordinates. The multiple sources of defect coordinates that are combined may include, for example, output from design inspection, reticle inspection, and PWQ inspection. The method may also have flexibility such that the user can select the sources of defect coordinates.

The embodiments described herein can, therefore, be used to generate a sample of locations on a wafer to be reviewed for systematic defects. For example, the coordinates of the locations on the wafer to be reviewed during the defect review are determined as described herein such that results of the defect review performed at the locations can be used to determine if the defects cause systematic defects on the wafer. Therefore, the coordinates of the locations on the wafer to be reviewed during the defect review determined as described herein may constitute a systematic (or potential systematic) defect sample. As shown in FIG. 1, therefore, DDR 28 may be performed using a combination of the output of two or more of the design inspection system, the mask inspection system, and the PWQ inspection system.

The embodiments described herein, therefore, use a defect review system to perform defect review at discrete locations on a wafer to essentially inspect those locations for systematic defects. In addition, those discrete locations on the wafer may be inspected using the defect review system regardless of whether or not defects were detected on the wafer by inspection of the wafer. Instead, as described further herein, those locations are inspected by the defect review system to determine if a potential systematic defect causing mechanism in a design and/or reticle has caused systematic defects on the wafer. As such, in embodiments described herein, a defect review tool may essentially be used for discrete inspection of a wafer for in-line monitoring and other applications described herein. In contrast to the embodiments described herein, defect review tools are not currently used for inspection purposes because the throughput of defect review tools is substantially lower than inspection tools thereby making inspection using defect review tools highly disadvantageous particularly for inline monitoring applications. However, as described further herein, discrete locations on wafers are inspected using a defect review tool to determine if systematic defects are present on the wafers in embodiments described herein thereby significantly reducing the area on the wafers that is inspected by the defect review tool and essentially eliminating the throughput concerns of using a defect review tool for inspection purposes.

The coordinates of locations to be reviewed during DDR 28 for systematic defects may be provided to defect review system 32 shown in FIG. 1. For example, a system configured to perform the computer-implemented method may be coupled or connected to the defect review system such that the system can send the coordinates of the locations to be reviewed during DDR to the defect review system. A system configured to perform one or more embodiments described herein may include any suitable architecture that can be used to connect with all relevant systems (e.g., one or more reticle inspection systems, one or more design inspection systems, one or more PWQ inspection systems, one or more other systems described herein, etc.). For example, a system configured to perform one or more embodiments described herein may include a "stand-alone" computer system that is coupled to the above-described systems and to a review system such as those described herein such that the computer system can receive output from any of the systems and send output to any of the systems. In this manner, a system configured to perform one or more embodiments described herein may be configured to have connectivity to systematic defect inspection systems such as those described above to translate coordinates from one or more sources (e.g., reticle defect coordinates, design defect coordinates, photo defect coordinates, or some combination thereof) into wafer coordinates for review by a review system such as the defect review system shown in FIG. 1. In another example, the system configured to perform the computer-implemented method may be the defect review system. Defect review system 32 may include any suitable defect review system known in the art such as the eDR-5xxx systems commercially available from KLA-Tencor (e.g., with appropriate modifications to add functionality described herein). Defect review system 32 may also be configured to perform electron beam imaging and/or optical imaging and possibly any other defect review and/or analysis functions described herein. Such systems may be further configured as described herein.

The embodiments described herein, therefore, advantageously include determining locations on a wafer for systematic defect review. In this manner, the method effectively creates a systematic defect review sample. For example, as described further herein, the embodiments described herein include determining locations on a wafer for DDR for systematic defects. However, the embodiments described herein may also advantageously include determining locations on a wafer for both systematic defect review and random defect review. In addition, some embodiments described herein may include performing both systematic and random defect review.

For example, in one embodiment, the method includes acquiring results of inspection of the wafer and randomly selecting defects detected by the inspection of the wafer from the results of the inspection for review during the defect review. The locations on the wafer for which the coordinates were determined as described above constitute a systematic defect sample, the randomly selected defects constitute a random sample, and the defect review for the systematic defect sample and the random sample is performed in the same defect review process. For example, during the wafer processing phase, which may include wafer processing such as etch, deposition, chemical-mechanical polishing (CMP), etc., a wafer inspection system may be used to inspect wafers that have been processed. Output of the wafer inspection system may include information about process defects (e.g., information about defects detected on the wafers that have been processed).

In particular, as shown in FIG. 1, wafer inspection system 34 may be used to inspect a wafer after wafer processing 36, which may include any of the wafer processing described above. The wafer inspection system may include any appropriate wafer inspection system known in the art such as the 23xx series tools, 28xx series tools, AIT tools, Puma 9000 series tools, and Puma 91xx series tools, which are commercially available from KLA-Tencor. Results 38 produced by the wafer inspection system may include process defects or defects that are caused by the wafer processing. The method may include acquiring results 38 and randomly selecting defects from results 38 for review during the defect review. Results 38 may be acquired as described herein, and defects may be randomly selected from results 38 in any suitable manner. Defects randomly selected from results 38 may be reviewed by electron beam review and classification (EBRC) 40 as shown in FIG. 1, which may be performed by defect review system 32. In this manner, the process defects detected by the wafer inspection system may be reviewed by a review system such as an EBRC system. However, the same defect review system may be used to perform both DDR for the systematic or potential systematic defects and EBRC for the random defect sample. Such a defect review system may be further configured as described herein.

In one embodiment, prior to the defect review, if analysis of results of the inspection of the wafer indicates that one or more of the defects detected by the inspection of the wafer are systematic defects, the method includes adding the one or more of the defects to the systematic defect sample and if the one or more of the defects are included in the random sample, removing the one or more of the defects from the random sample. For example, analysis of the results of the inspection of the wafer may include design-based binning (DBB) 42, which may be performed by the wafer inspection system, a system configured to perform the computer-implemented method embodiments described herein, another stand-alone computer system, the defect review system, or any other suitable system. DBB may be performed as described in the above-referenced patent applications by Kulkarni et al. and Zafar et al. DBB may be used to identify process defects that are systematic defects or potential systematic defects on the wafer using the wafer inspection results.

Therefore, if DBB determines that defects detected by inspection of the wafer are systematic or potential systematic defects, those defects may be added to the systematic defect sample (e.g., by combining the coordinates of those defects with the coordinates on the wafer translated from coordinates included in results 14, 20, and 26 so that they are included in single source of defect coordinates 30 at which DDR 28 is performed). If the defects on the wafer identified as systematic or potential systematic defects by DBB have coordinates on the wafer that are already included in the coordinates translated from results 14, 20, and 26, the single source of defect coordinates may include only one instance of those coordinates such that the location on the wafer corresponding to those coordinates is reviewed only once for a systematic defect. If the defects on the wafer identified as systematic or potential systematic defects by DBB are included in the sample of defects that was randomly selected for defect review, those defects may be removed from the random defect sample such that the defects are not reviewed during EBRC, in this manner, defects or locations of potential defects will not be reviewed twice during both DDR and EBRC. DBB may also be used in combination with the wafer inspection system to identify lithography hot spots and/or to alter (e.g., correct) the lithography hot spots in results 26 generated by the PWQ inspection system.

Figure 2:
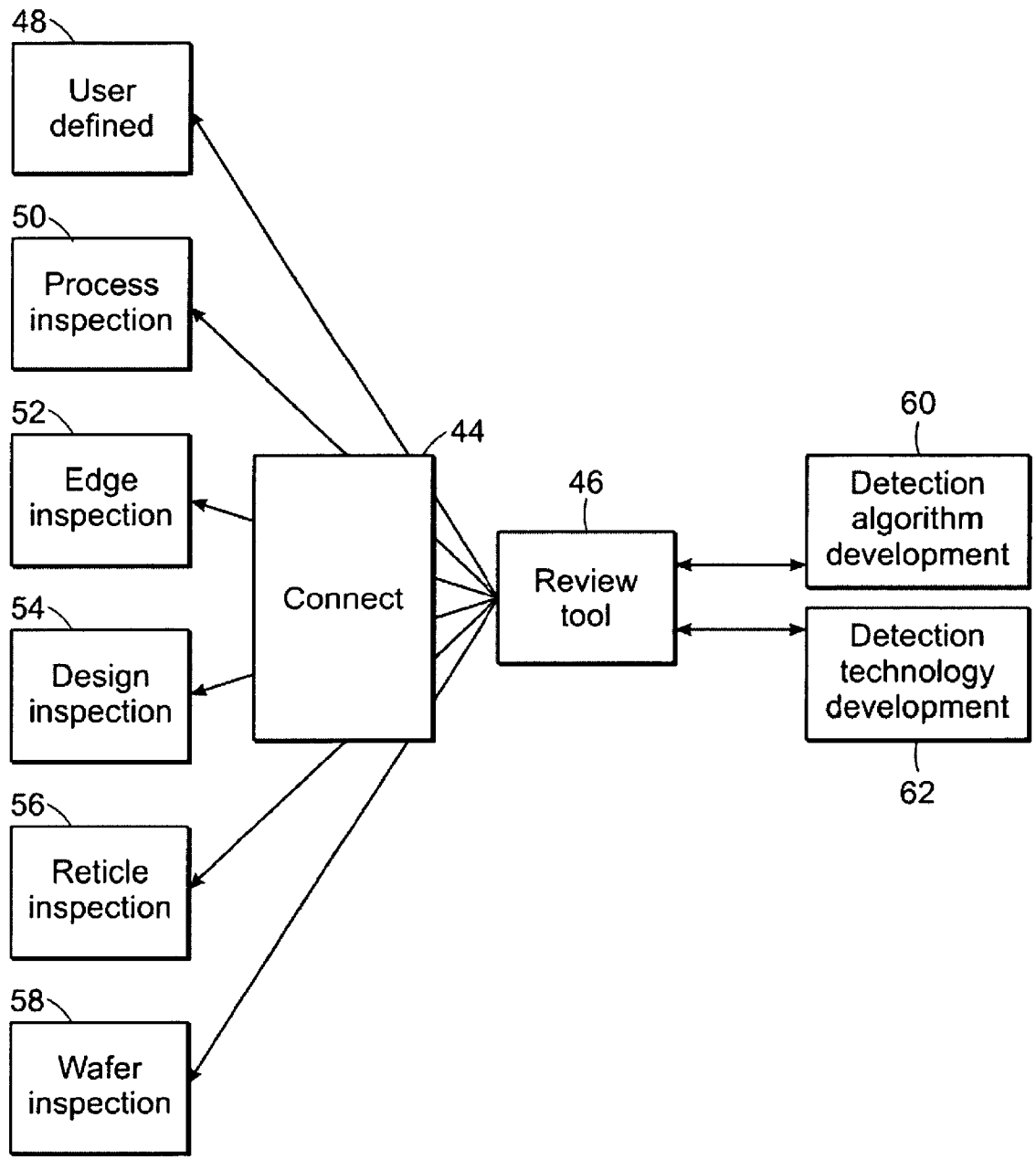
FIG. 2 is a block diagram illustrating one embodiment of a system configured to determine locations on a wafer to be reviewed during defect review and embodiments of steps that may be included in embodiments of a computer-implemented method for determining locations on a wafer to be reviewed during defect review.

In another embodiment as shown in FIG. 2, the method includes connecting step 44 in which a system configured to perform embodiments described herein such as review tool 46 may be coupled to a number of other different systems. For example, the review tool, which may include an eDR-5xxx system, may be coupled to another system such that the system can receive one or more user-defined parameters 48 from the other system. The system from which the one or more user-defined parameters are received may be, for example, a stand-alone computer system. The one or more user-defined parameters may include, for example, parameters of the defect review to be performed on the wafer. In addition, the review tool may be coupled to process inspection system 50, which is configured to inspect wafers after processes such as etch, deposition, and CMP have been performed on the wafers. The process or wafer inspection system may be further configured as described herein. The review tool may also be coupled to edge inspection system 52, which may include any suitable edge inspection system known in the art configured to inspect an edge of a wafer. The review tool may be further coupled to design inspection system 54, a system configured to perform lithography-related inspection (not shown in FIG. 2), a PWQ inspection system (not shown in FIG. 2), or any other system configured to detect lithography-related defects in a design or on a reticle. These systems may be further configured as described herein. Furthermore, the review tool may be coupled to reticle inspection system 56, which may be configured as described herein. Moreover, the review tool may be coupled to wafer inspection system 58, which may be configured as described herein. The output of the wafer inspection system acquired by the review tool may be acquired in any suitable format such as a KLARF file. In addition, the review tool may be coupled to any other suitable system(s).

The review tool may be connected to each of these other systems using closed format technology such as that commercially available from KLA-Tencor. The review tool may be coupled to each of these other systems such that the review tool can send output generated by the review tool to one or more of the other systems and receive output from one or more of the other systems. The review tool may use the output acquired from the other systems to determine coordinates of locations on the wafer to be reviewed during the defect review by translating the coordinates of the defects into the coordinates on the wafer such that results of the defect review performed at the locations can be used to determine if the defects cause systematic defects on the wafer. The review tool may be configured to determine the coordinates of the locations according to any of the embodiments described herein.

As shown in FIG. 2, the method may include detection algorithm development 60. The detection algorithm development may include developing one or more algorithms that can be used in the embodiments described herein to detect defects on the wafer or by other systems or methods to detect defects on the wafer, on the reticle, or in a design. Such detection algorithms may include one or more of a die-to-die detection algorithm, a patch image-to-die detection algorithm, a die-to-reference image detection algorithm, a referenceless defect detection method, and a die-to-database detection algorithm. The die-to-die detection algorithm may be used for detecting defects on the wafer. The patch image-to-die detection algorithm may be used by the edge inspection system, the design inspection system, a PWQ inspection system, or the reticle inspection system to detect defects on the edge of the wafer, in the design, or on a reticle. For wafer locations with no pattern visible, a referenceless defect detection method may be used. In addition, the die-to-reference image detection algorithm and the die-to-database detection algorithm may be used by any of the inspection systems described herein to detect any of the defects described herein. Furthermore, detection algorithm development 60 may include developing one or more algorithms that can be used by the review tool to detect defects on the wafer, which may include any of the algorithm(s) described herein. Detection algorithm development may be performed using any results generated by the review tool, possibly in combination with any of the results generated by any of the inspection systems described herein.

Detection algorithm development may be performed by any of the systems described herein.

As further shown in FIG. 2, the method may include detection technology development 62. The detection technology development may include determining which technologies are most suitable for use in the embodiments described herein. Such technologies may include, for example, scanning electron microscope (SEM) imaging, optical microscope (OM) imaging, electron dispersive x-ray spectroscopy (EDX or EDS), current measurement, tilt SEM imaging, delayering technologies, or some combination thereof. Examples of delayering technologies are described in commonly owned U.S. patent application Ser. No. 11/086,048 by Nasser-Ghodsi et al. filed Mar. 22, 2005, which published as U.S. Patent Application Publication No. 2005/0221229 on Oct. 6, 2005, and which is incorporated by reference as if fully set forth herein. Detection technology development may be performed using any results generated by the review tool, possibly in combination with any of the results generated by any of the inspection systems described herein, Detection technology development may be performed by any of the systems described herein. The detection technology that is developed may be used by the review tool for defect review and/or any other functions performed by the review tool.

Figure 3:
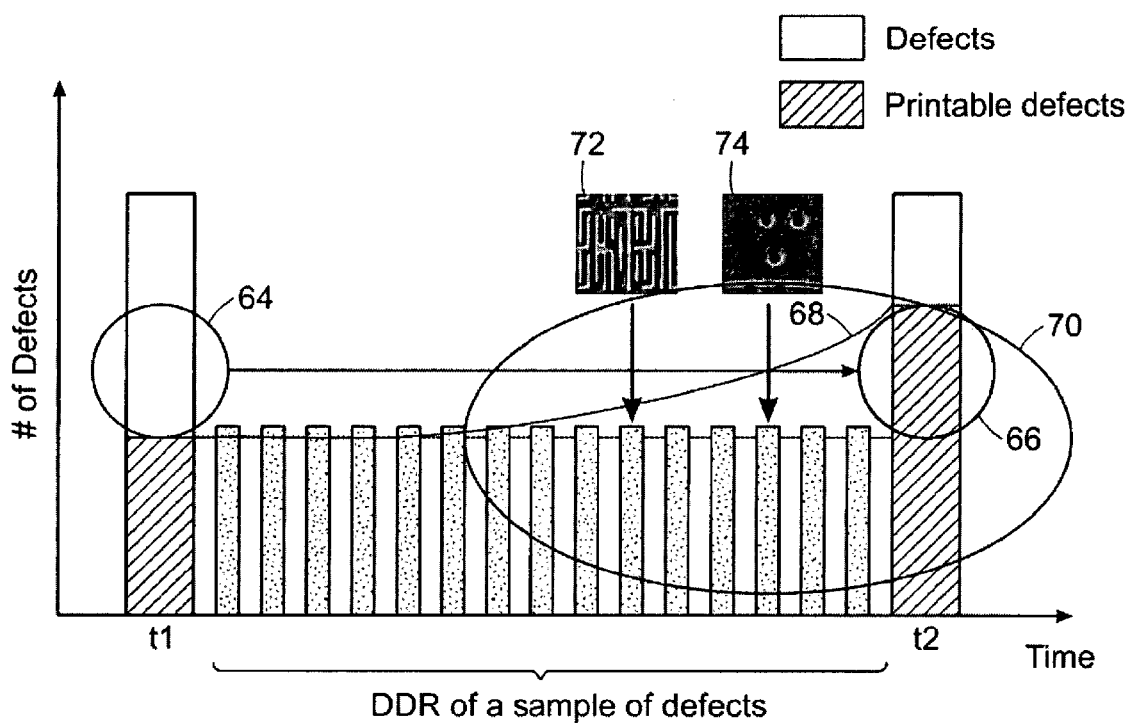

The embodiments described herein may be particularly advantageous for use in applications such as in-line monitoring of reticle defects and contamination. For example, as shown in FIG. 3, at a first point in time (t1), reticle inspection is performed using a system such as the Starlight system. The reticle inspection performed at t1 may be performed for reticle qualification before the reticle is released to manufacturing. As shown in FIG. 3, at t1, a number of defects were detected on the reticle, and the defects include a number of printable defects (i.e., defects that will print on a wafer).

At a second point in time (t2), reticle inspection is again performed using a system such as that described above. The reticle inspection performed at t2 may be performed for reticle re-qualification some period of time after the reticle was released to manufacturing. As shown in FIG. 3, at t1 and t2, approximately the same number of total defects were detected on the reticle. However, a greater number of the defects detected at the second point in time are printable defects. Therefore, between t1 and t2, the printability of some of the reticle defects changes. For example, as shown in FIG. 3, circled portion 64 of the numbers of defects detected at t1 and circled portion 66 of the number of defects detected at t2 illustrate the differences between the numbers of printable defects detected at the two different points in time and the number of defects that may have become printable between the two points in time.

Such a change in the printability of the defects on the reticle may be due to contamination on the reticle that becomes printable defects and are printed, which may cause yield loss. For example, such a change in the printability of the reticle defects may include crystal growth defects that initially are not printable but become printable over time. The printability may change after t1 relatively slowly, but may change much more quickly as t2 approaches, as shown in FIG. 3 by upwardly sloping line 68 between the numbers of defects detected at t1 and t2. If previously non-printable defects become printable defects and are printed on a wafer, these defects may cause yield loss. Therefore, it would be advantageous to detect such defects at the earliest possible time. In particular, it would be advantageous to detect newly printable defects as soon as possible after the number of printable defects begins to increase (e.g., during the time shown by oval

70 in FIG. 3). However, currently available systems and methods may not be able to detect the defects that become printable over time. For example, currently available systems and methods may not be able to detect defects of a size at which the previously non-printable defects become printable.

The embodiments described herein, however, may be used to perform DDR of a sample of defects a number of times at time points between t1 and t2. In particular, DDR may be performed for a sample of locations on the wafer at which the defects detected on the reticle may be printed. For example, DDR may be performed using the reticle inspection results generated at t1 to generate a process in which locations of the non-printable defects detected at t1 in reticle coordinates are inspected on wafers at wafer coordinates corresponding to the reticle coordinates. In addition, the embodiments described herein may be configured for determining wafer coordinates of locations to be reviewed on the wafer based on the reticle inspection results generated at t1, possibly in combination with wafer inspection results acquired at a time point corresponding to the time point at which DDR is being performed. In this manner, the embodiments described herein may be used for determining a sample of defects for which DDR is to be performed based on the reticle inspection results generated at t1 and the wafer inspection results acquired at the time point corresponding to the time point at which DDR is being performed. DDR results may, therefore, be used to determine that at some point in time between t1 and t2, a reticle defect becomes printable. One example of such a defect is shown by image 72 included in FIG. 3. In addition, DDR results may be used to determine that at another later point in time between t1 and t2, another reticle defect becomes printable, one example of which is illustrated by image 74 shown in FIG. 3, Information about the defects that become printable may be used to, for example, determine yield relevancy of the defects that became printable, which may be used to make one or more decisions about the reticle (e.g., repair). Such information may also be used in any of the steps of any of the methods described in the above-referenced patent applications by Kulkarni et al. and Zafar et al.

In-line monitoring of reticle defects and contamination described above provides significant value. For example, the embodiments described above may be used to detect printable mask defects as early as possible, which may allow major yield losses to be avoided. In addition, the embodiments described above have substantially high sensitivity to defects due to the substantially high resolution imaging and possibly measurements that may be performed by the defect review tool to detect, review, and/or measure the defects. Furthermore, the embodiments described herein provide relatively fast and non-expensive solutions to monitor wafers, which can be performed together with DDR by relatively fast and relatively accurate EBRC.

The embodiments described herein also provide a number of advantages for in-line monitoring of reticle defects and reticle defect classification. For example, the embodiments described herein provide a direct link to reticle inspection systems such as Starlight. In addition, DDR provides substantially high location accuracy. Furthermore, the embodiments described herein provide off-line automatic recipe setup that is capable of dealing with a relatively large number of defects. For example, the embodiments described herein may be configured for automatically detecting a recently completed reticle inspection and automatically creating a monitor plan based on some combination of the design for the wafer as well as the reticle inspection results. This monitor recipe may then be automatically run on some subset of the wafers printed using the inspected reticle.

The embodiments described herein may also be used for in-line monitoring of design hot spots and process window. For example, as shown in FIG. 4, three different process windows (e.g., PW1, PW2, and PW3) may be monitored over time. The first process window, PW1, is a process window across different values of one or more parameters of a deposition process and different values of one or more parameters of an etch process, as shown by plot 76 in FIG. 4. The one or more parameters of the deposition process and the etch process may include any controllable parameters of these processes. Such a process window may be determined using a number of wafers processed with different sets of values of the one or more parameters of the deposition process and values of the one or more parameters of the etch process. Detecting defects on such wafers may include performing a wafer-to-wafer comparison, which may be performed as described in the above-referenced patent applications by Kulkarni et al. and Zafar et al. Wafer-to-wafer comparisons may also be performed in the embodiments described herein as described in commonly owned U.S. Patent Application Ser. No. 60/974,030 by Bhaskar et al. filed Sep. 20, 2007, which is incorporated by reference as if fully set forth herein. Such process window inspection may be advantageously performed to detect defects caused by interactions between processes and interactions caused by various values of wafer-level process parameters. The second process window, PW2, is a process window across various values of exposure and various values of dose for a lithography process, as shown by plot 78 in FIG. 4. The third process window, PW3, may be any other suitable process window.

Defects detected by any of the process window inspections may be used to determine if a process has drifted out of the process window, is performing inside of the process window, or is performing near the edge of the process window, as indicated by the wafer maps shown in FIG. 4. In particular, wafer map 80 indicates a process that is out of the process window, wafer map 82 indicates a process that is within the process window, and wafer map 84 showing varying shading of the dies on the wafer indicates a process that is near the edge of the process window. As further shown in FIG. 4 in plot 86, where the processes are operating with respect to the process windows at various points in time affects how many defects are detected on wafers at the various points in time. For example, when a process goes out of its process window as indicated in plot 86 by shading corresponding to wafer map 80, hot spots may turn into defects on the wafer, which may cause yield loss. A process that is within its process window is indicated in plot 86 by shading corresponding to wafer map 82, while a process that is near the edge of its process window is indicated in plot 86 by shading corresponding to wafer map 84.

DDR may, therefore, be advantageously used for in-line monitoring by reviewing a sample of locations on wafers at which systematic defects may have been caused by defects other than process defects at the various points in time, as shown in FIG. 4. For example, DDR can be used to determine that a defect, one example of which is shown in image 88, appears on one or more wafers at the fourth point in time shown in FIG. 4 while a second, different defect, one example of which is shown in image 90, appears on one or more wafers at a later point in time. DDR may be advantageously performed as described above to detect hot spots that turn into defects when a process goes out of its process window, which may cause yield loss.

Such DDR may be performed based on design hot spot information, which may be generated by a design inspection system, and process window information, which may be generated by a PWQ inspection system. For example, the sample of defects may include locations of design hot spots on the wafer, and the locations of the design hot spots on the wafer may be determined based on output of the design inspection system as described further herein. The embodiments described herein may use defects detected at the design hot spots to determine if a process is out of the process window. The embodiments described herein may also use the defects detected at the design hot spots to determine values of one or more parameters at which the one or more processes were performed on the wafers. For example, the embodiments described herein may include comparing output of the review system such as images of the defects with output generated by a PWQ inspection system, and the values of the one or more parameters at which the PWQ inspection was performed corresponding to defects that, in at least some respect, match the defects detected by DDR may be determined as the values of the one or more parameters at which the process was performed on the wafer.

In-line monitoring performed as described above using DDR, design hot spot information, and process window inspection output provides significant value for semiconductor manufacturing. For example, DDR allows detection of defects on wafers caused by design and/or photo defects as early as possible, which may allow major yield losses to be avoided. In addition, using DDR for in-line monitoring as described above provides substantially high sensitivity for defects due to the substantially high resolution imaging and possibly measurements that can be used for DDR. In addition, results of design inspection may be used to determine if a defect was not detected by an optical inspection system or an electron beam inspection system. In particular, DDR may be used to detect defects that could not be detected by optical or electron beam inspection. Such DDR may be performed using, for example, relatively high resolution SEM imaging, relatively high resolution tilt SEM imaging, focused ion beam (FIB) imaging, or some combination thereof. Furthermore, using DDR for in-line monitoring as described above provides a relatively fast and non-expensive solution for monitoring wafers, which can be performed together with relatively fast and relatively accurate EBRC.

In-line monitoring performed as described above using DDR also provides a number of advantages over other methods and systems for in-line monitoring. For example, the embodiments described herein provide a direct link to design inspection and PWQ inspection. In addition, DDR provides substantially high location accuracy. Furthermore, the embodiments described herein provide off-line automatic recipe setup that allows relatively large numbers of defects to be dealt with effectively. For example, the embodiments described herein may be configured for automatically detecting a recently completed process window inspection and automatically creating a monitor plan based on some combination of the design for the wafer as well as the process window inspection results. This monitor recipe may then be automatically run on some subset of the wafers on which the process is performed (wafers processed using the process for which process window inspection was performed).

The embodiments described herein are configured specifically for systematic defect detection and review, which may be performed in combination with defect review of other types of defects as described further herein. In contrast, currently used defect review systems and methods generally perform defect review for a sample of a population of defects detected on a specimen without regard to the type of the defects. In this manner, the currently used defect review systems and methods tend to review a substantial number of random defects on the specimen since most of the defects detected on the specimen may be random defects. Such defect review may be disadvantageous since systematic defects may be more yield relevant than random defects, and as such more information about the systematic defects is preferably generated such that the yield can be improved based on the systematic defect information.

However, as described herein, different types of defects may be detected on a specimen, the types of the individual detected defects may be identified, and/or the different types of defects can be separated from each other by binning. Therefore, the embodiments described herein can use such information about the defect type to monitor all types of defects and monitor all types of defects together as described further herein. In addition, no systems that can be used for the overall set of applications described herein are currently available. Some manual cumbersome step-by-step process may be used to try to perform some of the functions described herein. However, such a process would have a number of disadvantages. For example, such a process would take a substantially long time, is manual, is complicated to implement, requires extensive expertise is not repeatable, and is therefore difficult to implement and maintain. In contrast, the embodiments described herein enable the integration of information from several subsystems or systems together with enhanced software and/or algorithms to provide the user with an easy to use, stand-alone application to detect and review systematic defects. In addition, the embodiments described herein may be implemented by modifying an existing defect review system such as an EBRC system commercially available from KLA-Tencor or by creating an entirely new defect review system.

The embodiments described herein also have a number of additional advantages. For example, the embodiments described herein are capable of detection and classification of all defects of interest (DOIs). In addition, the embodiments described herein meet high volume production requirements both in terms of reliability and cost. The embodiments described herein also use leading imaging technology at 45 nm and 32 nm technology nodes such as high resolution and high contrast SEM and OM imaging. The embodiments described herein further provide 100% automation success for automatic defect locating (ADL), and 95% ADL success at the 45 nm technology node. Such ADL may be performed using a combination of SEM and OM technologies. In addition, the embodiments described herein may be used for review inspection cycle optimization (RICO) by using results generated by the review system to alter and even optimize inspection recipes.

Furthermore, the embodiments described herein can use both disruptive and non-destructive technologies for defect classification. The defect classification described herein can be used in combination with other defect classification methods such as electron beam power assisted classification (ePAC) to enhance the other methods of defect classification. Examples of methods and systems that can be used to perform ePAC are described in commonly owned U.S. patent application Ser. No. 11/249,144 by Teh et al. filed Oct. 12, 2005 published as U.S. Patent Application Publication No. 2006/0082763 on Apr. 20, 2006, which is incorporated by reference as if fully set forth herein. In addition, the embodiments described herein can perform elemental analysis for defects having sizes greater than about 20 nm. The embodiments described herein can also perform defect classification as described herein in combination with defect classification of new DOIs located "in-film" and high aspect ratio defects using a delayering method or system such as those described in commonly owned U.S. patent application Ser. No. 11/086,048 filed Mar. 22, 2005 by Nasser-Ghodsi et al. published on Oct. 6, 2005 as U.S. Patent Application Publication No. 2005/0221229, which is incorporated by reference as if fully set forth herein.

Moreover, the embodiments described herein may increase overall defect detection and classification. Therefore, the embodiments described herein provide innovative technologies that may be used in high value use cases.

Figure 5:
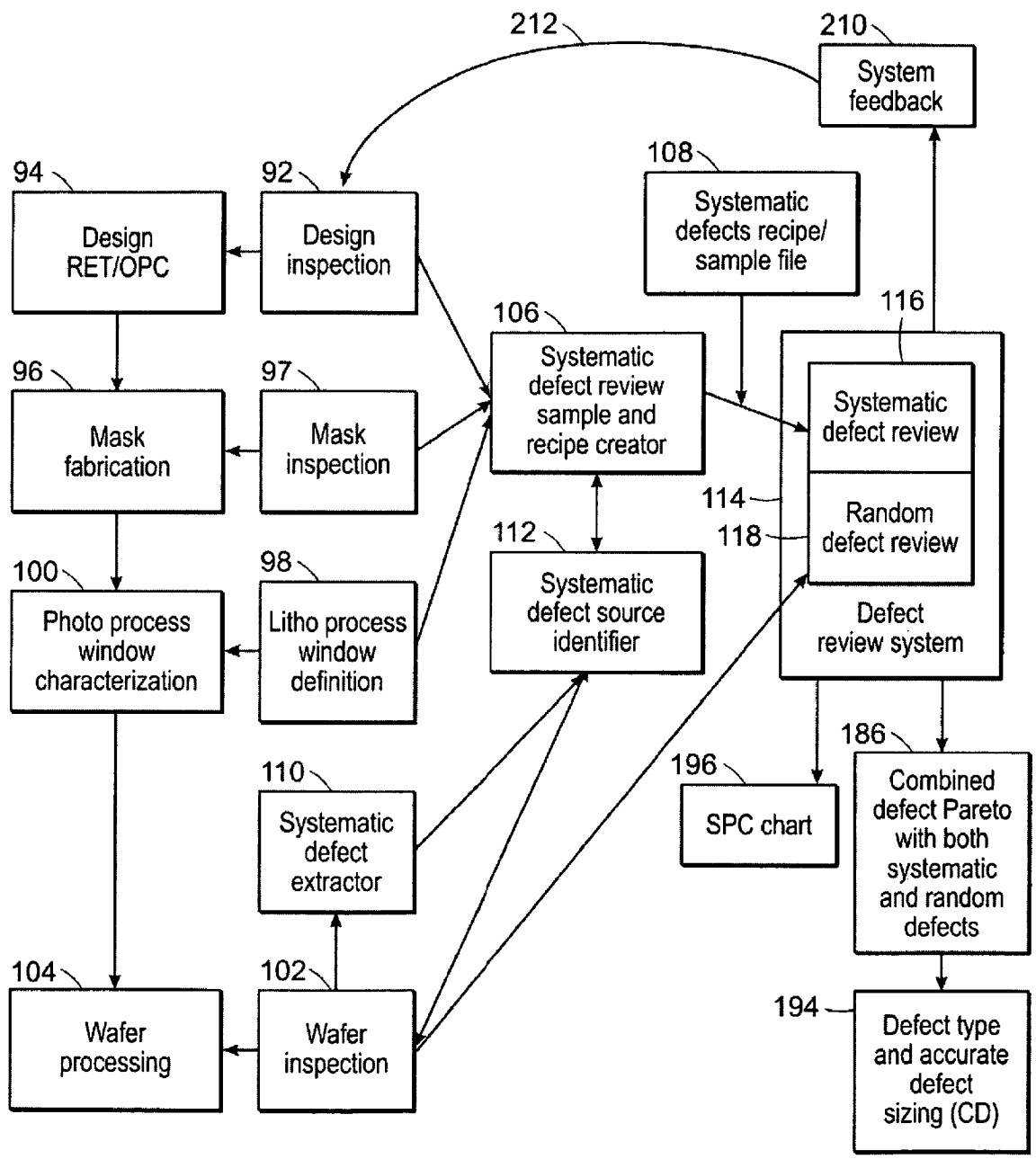
FIG. 5 is a block diagram illustrating one embodiment of a system configured to determine locations on a wafer to be reviewed during defect review and one embodiment of a computer-implemented method for determining locations on a wafer to be reviewed during defect review.

In another embodiment shown in FIG. 5, design inspection 92 of design 94 may be performed after RET and/or OPC features have been added to the design. Mask fabrication 96 may be performed using design 94. Mask inspection 97 may be performed on the mask after mask fabrication 96. Lithography process window definition 98 may be performed using results of photolithography process window characterization 100 performed using the mask fabricated by mask fabrication 96. Wafer inspection 102 may be performed after wafer processing 104. One or more processes included in wafer processing 104 are processes performed using the mask fabricated by mask fabrication 96. Each of these steps may be performed as described further herein.

In one embodiment, the method includes creating a recipe for the defect review using coordinates of the locations determined as described herein and a design for the wafer. In one such embodiment, creating the recipe is performed offline without imaging the wafer or defects on the wafer. In this manner, the embodiments described herein may include creating a systematic defect review recipe, which may be performed by systematic defect review sample and recipe creator module 106 shown in FIG. 5. For example, the capability to drive relatively accurately to a defect location is particularly advantageous for systematic defect review. The systematic defect review recipe creator module may be a design-based setup engine that uses some design information (e.g., information about the design to be printed on the wafer and the layout in which the design will be printed) to automatically setup a recipe that will allow the review system to locate the systematic defects. In addition, as shown in FIG. 5, systematic defect review sample and recipe creation may be performed as described further herein using output generated by design inspection, mask inspection, and lithography process window definition. Setup may be performed "off-line" without the need for imaging of the wafer and/or defects on the wafer.

The method may include creating a systematic defect sample and recipe (SDSR) file 108, as shown in FIG. 5. In one embodiment, the method includes creating an encrypted and secured file that includes the coordinates of the locations on the wafer to be reviewed during the defect review. For example, the SDSR file may be an encrypted and secured file that would include and protect all required information to enable a system to drive substantially accurately to a systematic defect location to capture an image of the defect. In this manner, the file may allow secure exchange of design information.

The embodiments described herein may also be configured for systematic defect extraction, which may be performed by systematic defect extractor module 110 shown in FIG. 5. Systematic defect extraction may be performed using output generated by wafer inspection. For example, the module may be configured to separate systematic defects from random defects in a population of defects detected by wafer inspection and to add the systematic defects to the previously described sample, which may be performed as described herein. Extraction may also be performed by DUB or using design information for the defects. In addition, the embodiments may be configured to perform detection methods for systematic defects utilizing design information and critical dimension (CD) measurements, possibly in combination with any of the other information described herein.

The embodiments described herein may include identifying a systematic defect source, which may be performed by systematic defect source identifier module 112, as shown in FIG. 5. As further shown in FIG. 5, the systematic defect source identifier module may be configured to identify the systematic defect source using output generated by systematic defect extractor module 110 and systematic defect review sample and recipe creator module 106. In one embodiment, the method includes determining if systematic defects detected on the wafer by inspection of the wafer are correlated to defects detected by the two or more inspection systems (e.g., the design inspection system, the mask inspection system, the PWQ inspection system, or some combination thereof). For example, the method may include correlating a systematic defect that was found by a wafer inspection system to a previously detected and identified systematic defect using combined information from all systematic defect inspectors thereby identifying the source of the systematic defect detected on the wafer. The systematic defect source identifier module may include a data structure such as a database including all inspection results (e.g., reticle, design, etc.) and a data mining engine that can be used to identify the source of the systematic defect. The data structure may be created as described further herein.

In a further embodiment, the defect review system is configured as a combined random and systematic defect review system as shown by defect review system 114 of FIG. 5, which includes systematic defect review module 116 and random defect review module 118. However, a single review module may be configured for systematic and random defect review. As shown in FIG. 5, SDSR file 108 may be provided to systematic defect review module 116, and output of wafer inspection 102 such as a KLARF file may be provided to random defect review module 118. For example, the defect review system may be configured to read both traditional KLARF files for random defect review and a SDSR file for systematic defect review and to perform both types of review at the same time on a wafer. Output from the defect review system may include results from both review of systematic and random defects.

Figure 6:
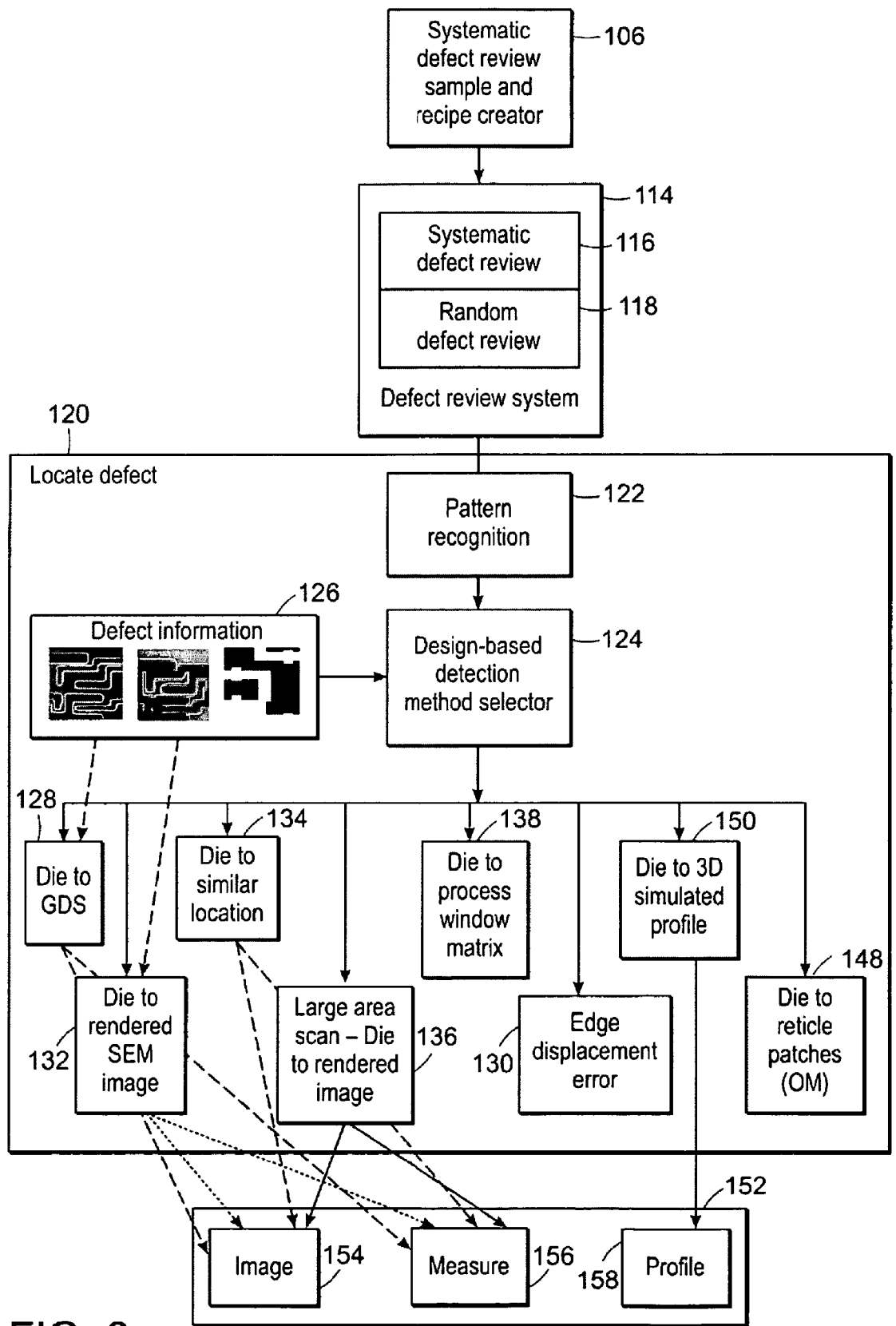
FIG. 6 is a block diagram illustrating a portion of one embodiment of a system configured to determine locations on a wafer to be reviewed during defect review and one embodiment of steps that may be included in embodiments of a computer-implemented method for determining locations on a wafer to be reviewed during defect review.

One embodiment of systematic defect detection that may be performed by the systematic defect review module described above is shown in FIG. 6. As shown in FIG. 6, output of systematic defect review sample and recipe creator module 106 may be provided to defect review system 114. The embodiments described herein may be configured to perform one or more systematic defect detection modes. For instance, as shown in FIG. 6, in locate defect step 120, the embodiments may use design-based pattern recognition (PR) 122 to locate defects. In one embodiment, the method includes identifying the locations on the wafer (determined as described herein) during the defect review by comparing images acquired during the defect review at the coordinates of the locations to a design for the wafer. In one such example, in order to drive substantially accurately to the systematic defect location, the defect review system may be configured to match some design information with an image of the die acquired by the defect review system. The method, called PR, will allow the defect review system to substantially accurately identify the locations of the defects. In such embodiments, the embodiments described herein may include performing off-line design-based recipe creation including PR.

In one embodiment, the method includes selecting a method for ADL to be performed during the defect review from all available methods for the ADL based on a design for the wafer. For example, as shown in FIG. 6, the system may include design-based detection method selector module 124, which may select the detection method based on defect information 126 that is provided to the selector module. The defect information may include any of the defect information or results from any of the inspection systems described herein such as patch images. In this manner, the method may include selecting a design-based dynamic ADL method. For example, the method may include using the design information to determine the best method to perform ADL from a selection of available methods.

One ADL method that may be available for use in the embodiments described herein is die-to-GDS ADL 128 shown in FIG. 6. This method may include comparing an image of the wafer (e.g., a SEM image, OM image, or any other type of image) to the design information for the wafer. The image of the die may undergo several image processing operations such as edge map creation and resizing in order to be compared with the design information. The resulting difference image may be used to generate a list of defect candidates and to identify the most probable cause. For instance, multiple differences may be detected or determined in a difference image, and the most probable defect in the difference image may be determined. The coordinates of the most probable defect may then be determined as the defect location.

Another ADL method that may be available for use in the embodiments described herein is comparative edge displacement error (EDE) 130 as shown in FIG. 6. This method may allow the user to visualize any difference between the pattern printed on the wafer and the expected pattern, as defined by the design. A combination of elaborated image processing and measurement algorithms may be used to create the EDE image of the pattern. EDE analysis may be performed for every single pattern previously imaged, and the point of statistical difference will be picked as a defect. Design information used in this ADL method may include information in the GDSII file itself or information from a substantially high resolution optical image from a reticle inspection system.

An additional ADL method that may be available for use in the embodiments described herein is die-to-rendered SEM image (rendered from a GDSII or patch image) ADL 132 as shown in FIG. 6. This ADL method may include comparing an image of the wafer (e.g., SEM image, OM image, or any other type of possible image) to the processed image of the design information, which may be commonly referred to as a "rendered image." The design sketch die may undergo several image processing operations with the intent to simulate how a specific feature would look when imaged with a relatively high resolution OM, a SEM, or any other type of imaging system.

A further example of an ADL method that may be available for use in the embodiments described herein is die-to-similar location ADL 134 as shown in FIG. 6. The similar location may be defined using a design or design information for the wafer. For example, design-based PR 122 may be used to locate a pattern that is substantially identical to the pattern proximate one of the defect locations and is located in a different area from the suspected defect location. The defect location may be compared to the similar location using any of the ADL methods described above to identify the location of the defect.

Yet another example of an ADL method that may be available for use in the embodiments described herein is a relatively large area inspection. For example, as shown in FIG. 6, ADL method 136 may include a relatively large area scan and use a die-to-rendered image comparison. This method may allow the utilization of one of the methods described above on an area that exceeds the typical field of view (FOV) of the imaging engine of the defect review system. The system may be able to automatically determine a list of images to generate in order to cover an area previously defined by the user. Several defects may be located across the scanned area and may be reported. Another example of an ADL method would be one that uses a single SEM defect image only. By detecting anomalies in the image itself, defect location may be accomplished without the use of a reference image to compare against.

Figure 7:
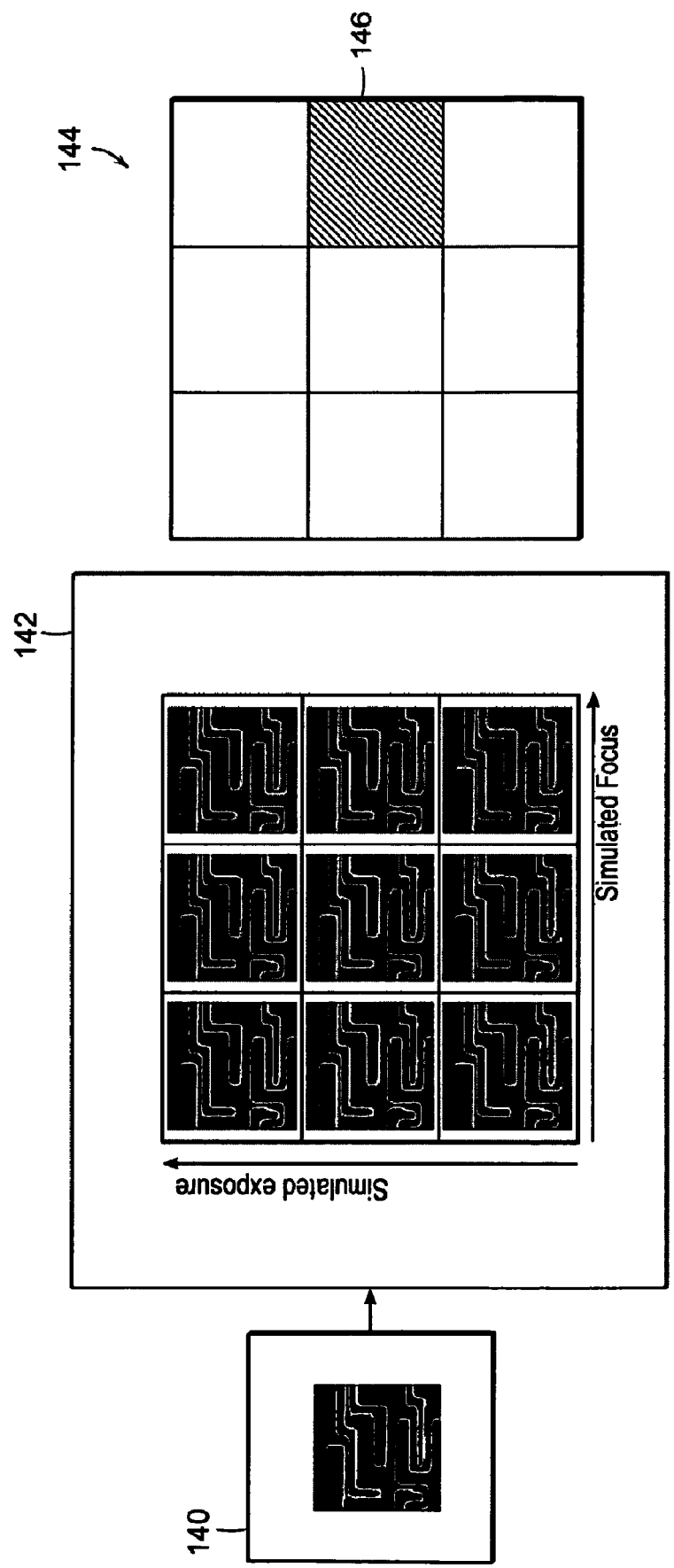
FIG. 7 is a flow chart illustrating one embodiment of steps that may be included in embodiments of a computer-implemented method for determining locations on a wafer to be reviewed during defect review.

In one embodiment, the method includes identifying the locations on the wafer during the defect review by comparing images acquired during the defect review at the coordinates of the locations to a design for the wafer and simulated images that illustrate how the design would be printed on the wafer at different values of one or more parameters of a process performed on the wafer. For example, another ADL method that may be used in the embodiments described herein is die-to-process window matrix ADL 138, as shown in FIG. 6. This method may include, as shown in FIG. 7, comparing image 140 of a die (a wafer image) acquired by the defect review system at coordinates of a location determined as described herein to not only the design of the die, but to the design of the die and a simulated (or rendered) process window matrix of images 142 of the die under different process conditions. The simulated matrix may be created by predicting the resulting image of the die for a given design when two or more parameters of the process window (e.g. focus and exposure) vary. In addition, the current sample image may be compared to a plurality of sample images representing various points in the process window, and the plurality of sample images may be stored in a data structure such as a library. Therefore, the embodiments may be configured for matching (or attempting to match) the current sample image against a library of stored sample images representing various points in the process window.

In one such embodiment, the method includes determining information about the process based on results of the comparing step described above. For example, as described above, the method may include comparing the image of the die to the simulated matrix to determine if the image matches one of the matrix components. Therefore, such ADL may provide the user with some information about the process used to produce the die. For example, as shown in FIG. 7, one of the simulated process window matrix images may be determined to match the wafer image, and the simulated process window matrix image that is determined to match the wafer image is indicated in results 144 in which the position of the simulated process window matrix image that matched the wafer image within the process window matrix is indicated by shading 146 shown in FIG. 7. Therefore, the comparison described above may be used to determine the focus and/or exposure values that caused the defect. In this manner, when design inspection and PWQ is performed, the effect of focus and exposure on the printing of the design can be determined. How the defect appears in the image of the wafer may then be used to determine how much the values of the parameters are off from the process window center. In this manner, the embodiments described herein can be used to detect and monitor drifts in one or more parameters of a process tool. Such information can be fed back to the process system or any other system that can be used to alter and/or correct the values of the parameters of the process used to fabricate the wafer on which the defect was detected.

Another example of an ADL method that may be available for use in the embodiments described herein is die-to-reticle inspection optical patch image ADL 148. As shown in FIG. 6, the patch images may include OM images. This method may include comparing a relatively high resolution optical image of the die with a relatively high resolution optical image previously generated by the reticle inspection system. The comparison enables re-location of the defect with substantially high accuracy.

An additional example of an ADL method that may be available for use in the embodiments described herein is die-to-three-dimensional (3D) simulated profile 150 as shown in FIG. 6. This method may include comparing a substantially high resolution image of a die cross-section generated on the system or off the system to a simulated image of the cross-section. The simulation of the cross-section may be created using design and process (e.g., etch, deposition, etc.) information. The die cross-section may be acquired using any suitable technology such as FIB, chemical or physical etching, tilt imaging, and transmission electron microscope (TEM) imaging.

The embodiments described herein may provide the user with several types of output for the defect in output acquisition step 152. For example, as shown in FIG. 6, after the defect has been located, output of any selected ADL method may be used to image 154, measure 156, or profile 158 a defect. In addition, the functions performed during output acquisition step 152 may vary depending on the type of ADL performed for the defect. For example, for die-to-GDS ADL 128, die-to-rendered SEM image ADL 132, die-to-similar location ADL 134, and large area scan—die-to-rendered image ADL 136, the output acquisition step may include imaging and measurement. In contrast, for die-to-3D simulated profile ADL 150, the output acquisition step may include profiling.

For imaging of the defect, several imaging modes may be available to generate an image of the defect. Different imaging modes may represent different versions of the system. Examples of suitable imaging modes include relatively high resolution SEM imaging, relatively high resolution optical imaging in several optical modes, relatively high resolution tilt SEM imaging, substantially high resolution ion beam imaging, substantially high resolution TEM imaging, and substantially high resolution atomic force microscope (AFM) imaging. The embodiments may also include performing one or more measurements of the defects. For example, using any of the suitable imaging modes described above, measurement of the defects may be performed using the acquired images and one or more algorithms. The embodiments described herein may also include profiling of the defects. For example, tilt and 3D imaging capabilities (provided, for example, by AFM or substantially high resolution imaging of a cross-section with SEM or TEM) may be used to provide a profile of a defect location.

The embodiments described herein may also include dynamic, "on-the-fly," sampling. For example, in one embodiment, the method includes determining, during the defect review, if additional locations on the wafer are to be reviewed based on results of the defect review at the locations on the wafer to be reviewed during the defect review determined as described herein and a design for the wafer proximate the locations. In this manner, the embodiments described herein may be configured for design-based dynamic sampling. Design-based dynamic sampling may include using the design information for a defect location to determine if further sampling is needed. For instance, if a "CD defect" was detected at a point in a critical speed path, other locations in the path could be reviewed to determine an overall effect on the circuit, or other die may be reviewed to determine if the defect is systematic.

In another embodiment, the method includes determining, during the defect review, if an additional operation is to be performed at the locations on the wafer based on results of the defect review at the locations and a design for the wafer. In this manner, the embodiments described herein may include design-based dynamic review actions. Design-based dynamic review actions may include using the design information to determine at runtime whether to perform additional review operations for any given defect. The additional review operations may include, for example, performing EDX automatically based on design information and topography analysis of the defect location. In one such example, the embodiments described herein may be configured for determining if SEM imaging is sufficient for classification. If the embodiments determine that SEM imaging is not sufficient for classification, the embodiments may determine that suitable additional review operations for defects that could not be classified by SEM imaging include other SEM imaging, delayering of the wafer proximate the defects, elemental analysis, or some combination thereof. Delayering may be performed as described in the above-referenced patent application by Nasser-Ghodsi et al. The additional review operations may also include performing further sampling across a die to further characterize the defect.

In an additional example, the embodiments described herein may be configured for dynamic sample creation for DDR and EBRC. For example, dynamic sample creation may include using the accumulated history of detected defects to create the optimum sample. In one such example, as described further herein, if a defect detected by a wafer inspection system is determined to be a systematic defect, the defect will be added to the sample for the DDR run, while being removed from the EBRC sample.

Output of the embodiments described herein may include defect perspectives, Pareto, charts, wafer maps, defect files, or some combination thereof. As described further herein, the output may include new types of reports and output for systematic defects.

Figure 8:
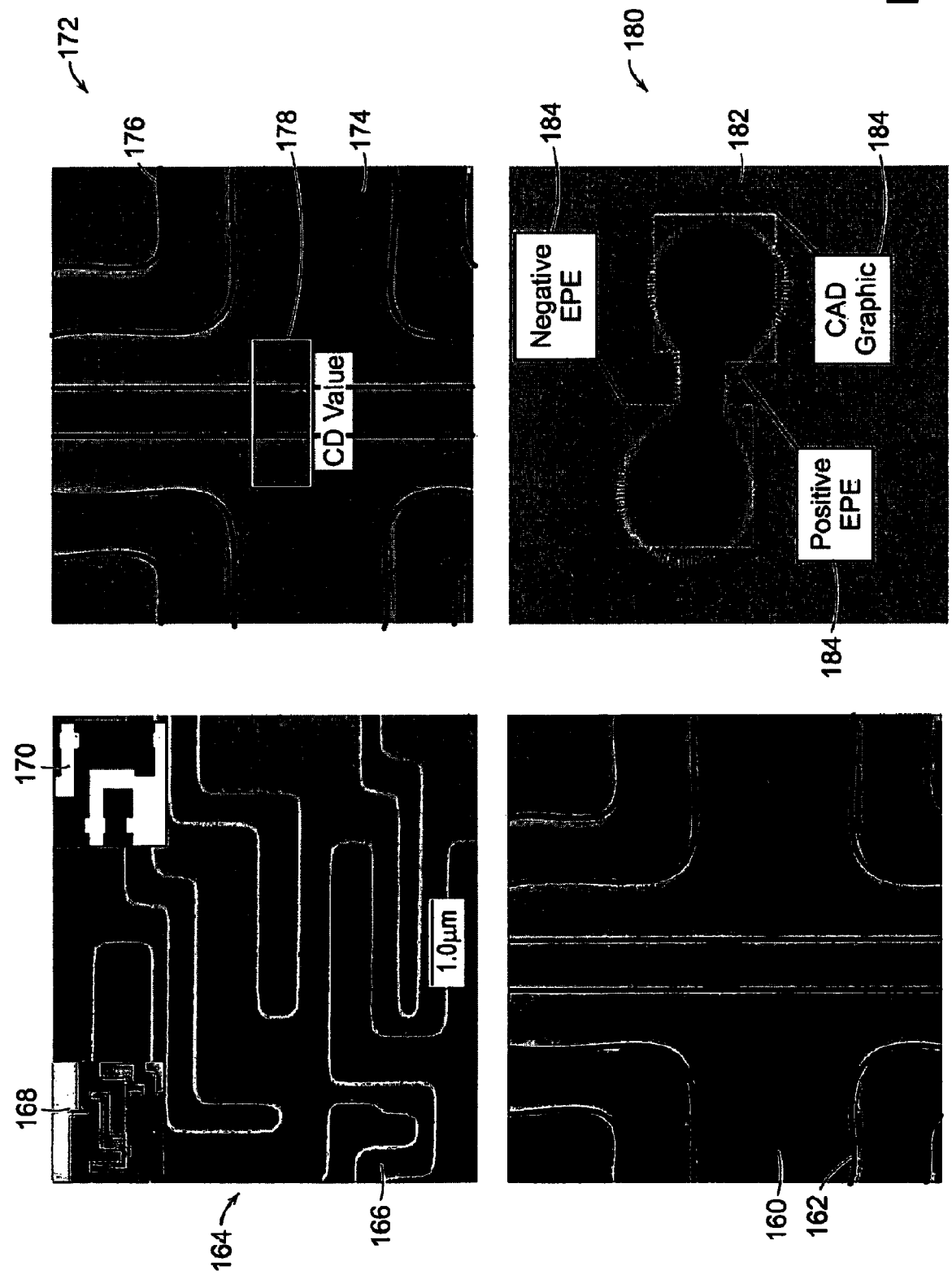
FIG. 8 is a schematic diagram illustrating examples of various embodiments of output that may be generated by the embodiments described herein.

Examples of different defect perspectives are shown in FIG. 8. One example of a defect perspective is overlay of a defect image and GDS. One example of overlay of a defect image and GDS is shown in example 160 in FIG. 8. Such a defect perspective may display an image generated by one of the imaging engines (e.g., OM, SEM, etc.) of the defect review system with the overlay of the corresponding design shown by lines 162 to allow the user to visualize the difference between the printed pattern and the design.

Another example of the defect perspectives is embedded patch images. One example of embedded patch images is shown in example 164 of FIG. 8. The defect perspective of embedded patch images may display image 166 generated by one of the imaging engines (e.g. OM, SEM, etc.) of the defect review system with different defect information 168 and 170 (e.g., design clips, OM patch images, etc.) of the defect providing the user with all of the defect information pre- and post-DDR. An additional example of the defect perspectives is image and CD measurements.

One example of such a defect perspective is shown in example 172 of FIG. 8. This perspective may include image 174 of the defect acquired using one of the imaging modes of the defect review system, lines 176 showing the corresponding design, and rectangle 178 showing the location at which a measurement was performed, and possibly the value of the resulting measurement (not shown).

A further example of the defect perspectives is image and EDE. One example of such a defect perspective is shown in example 180 of FIG. 8. This perspective may include image 182 of the defect acquired using one of the imaging modes of the defect review system with results 184 of the EDE measurement (e.g., negative edge placement error (EPE), positive EPE, and CAD graphic).

Yet another example of the defect perspectives is multi-layer perspectives. For example, the embodiments described herein may create a configurable image file (e.g., a multi-perspectives file) that can include all of the above perspectives. In this manner, each layer will be available to the user.

Output that includes Pareto and charts may include a combined systematic and random defect Pareto. For example, if the defect review includes defect review of a systematic defect sample and a random sample, which may be generated as described herein, in one embodiment, the method includes generating a Pareto chart illustrating results of the defect review of the systematic defect sample and the random sample. In one such example, as shown in FIG. 5, output of the defect review system may include combined defect Pareto with both systematic and random defects 186. Generating such a defect Pareto may include combining information from both DDR and EBRC runs. The output of the EBRC run used in this embodiment may include a KLARF that includes locations of defects and classifications assigned to defects. In one embodiment, the method includes classifying defects in the random sample identified by the defect review as systematic defects using DBB. For example, systematic defects found during the random mode review may be classified using DBB, which may be performed as described further herein. In this manner, the output may include a non-standard output (e.g., not a KLARF) that includes the embodiment's own set of coordinates. This new type of output may be sent to a software module such as Klarity, which is commercially available from KLA-Tencor.

Pareto and chart output may also include design-based extrapolated Pareto. For example, in one embodiment, the method includes using results of the defect review to determine locations of the systematic defects on the wafer and using a design for the wafer to determine additional locations on the wafer at which the systematic defects can be found. In one such embodiment, the embodiments may identify similar designs across the die to extrapolate the locations at which systematic defects were found during review of the sample to locations on the wafer at which the systematic defects may also be found. Therefore, design-based extrapolation of systematic defects may include detecting systematic defects, reviewing only a sample or subset of the systematic defects, and applying output of the defect review of the sample of the systematic defects to other defects on the wafer.

One example of such a Pareto chart is illustrated by Pareto chart 188 in FIG. 9. As shown in this Pareto chart, systematic defects detected by DDR may be illustrated separately from random defects, which may be detected by EBRC, but in the same Pareto chart. For example, the Pareto chart may include systematic defect portion 190 and random defect portion 192. In both the systematic defect portion and random defect portion of the Pareto chart, the number of defects that were or may be detected in different portions of the design for the wafer are shown as a function of the different portions of the design. Therefore, each of the bars shown in the Pareto chart corresponds to a different portion of the design. In addition, bars in the systematic defect portion and the random defect portion may correspond to the same portion of the design (e.g., since systematic defects and random defects may be detected in the same portion of the design). The systematic defects may be detected by DDR, which may be performed as described further herein. As shown in systematic defect portion 190 of the Pareto chart, systematic defects may be detected on a measured sample (e.g., by DDR and DBB) and may be "detected" by design-based extrapolation, which may be performed as described further herein.

In one embodiment, the method includes using results of the defect review to determine a kill ratio for defects found during the defect review by comparing the found defects to a design for the wafer and to determine a yield impact for the defects found during the defect review by comparing dimensions of the defects found during the defect review to dimensions of the design. For example, Pareto and chart output may further include design-based killer ratio. In one such example, a defect may be compared to a design for the wafer, and impact on yield may be determined for the defect by comparing defect dimensions to design dimensions. Such design-based yield impact information determined for systematic defects may also be illustrated in the Pareto chart shown in FIG. 9. Such design-based yield impact information determined for random defects may also be illustrated in the Pareto chart shown in FIG. 9.

In this manner, the embodiments described herein may be configured for design aware classification and defect Pareto. In addition, as shown in FIG. 5, the combined defect Pareto with both systematic and random defects output may be used to generate additional output 194 that includes defect type and substantially accurate defect sizing (e.g., CD). The additional output may include defect types and defect sizing for both systematic defects and random defects. The additional output may also include different portions, one portion of which includes defect types and defect sizing for systematic defects, a different portion of which includes defect types and defect sizing for random defects.

Output that includes wafer maps and defect files may include multiple KLARF formats and statistical process control (SPC) files. For example, as shown in FIG. 5, output of the systematic defect review module may include SPC chart 196. Examples of such SPC charts are illustrated in FIG. 9. For example, as shown in FIG. 9, SPC chart 198 may be generated that illustrates the yield impact for defect types. Each of the different lines shown in SPC chart 198 corresponds to a different defect type. Therefore, SPC chart 198 separately illustrates the yield impact of different defect types as a function of time. The yield impact of the different defect types may be determined in any suitable manner. In another example, as shown in FIG. 9, SPC chart 200 may be generated that illustrates the CD for measured systematic defects. Each of the different lines shown in SPC chart 200 corresponds to a different defect type. Therefore, SPC chart 200 separately illustrates the measured CD of different defect types as a function of time.

Figure 10:
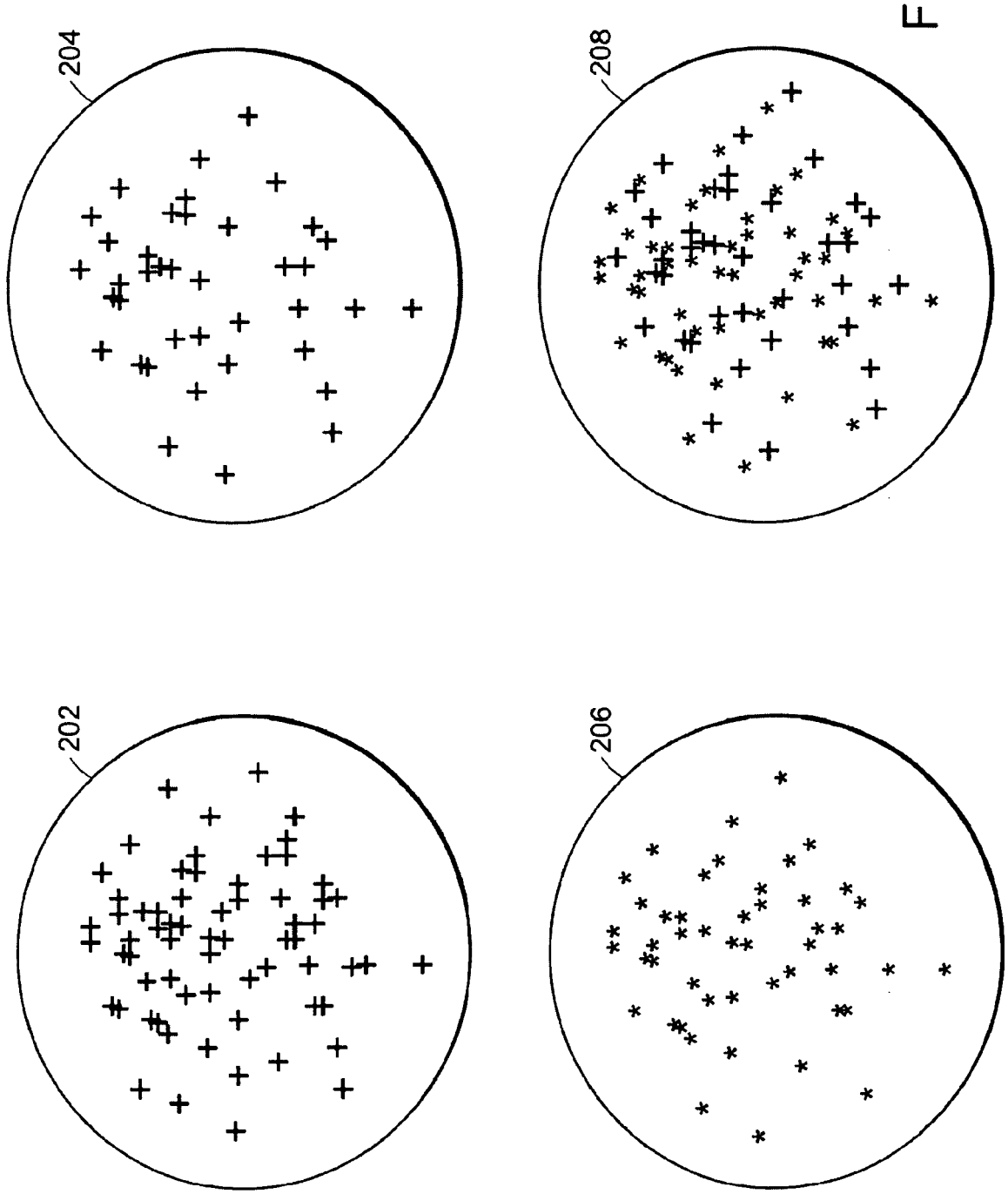
FIG. 10 includes examples of embodiments of wafer maps that may be generated by the embodiments described herein.

Examples of systematic defect output that include wafer maps and/or multiple KLARFs are illustrated in FIG. 10. As shown in FIG. 10, wafer map 202 generated from a first KLARF (KLARF 1) illustrates the entire DDR sample. As also shown in FIG. 10, wafer map 204 generated from another KLARF (KLARF 2) illustrates output of DDR for only defects. Therefore, wafer map 204 does not illustrate all locations at which DDR was performed. Instead, wafer map 204 illustrates only those locations at which DDR was performed and detected a defect. As further shown in FIG. 10, wafer map 206 generated from an additional KLARF (KLARF 3) illustrates output showing all defects detected by EBRC. In addition, as shown in FIG. 10, wafer map 208 generated from yet another KLARF (KLARF 4) illustrates output showing only defects detected by EBRC and DDR. In other words, wafer map 208 is essentially wafer map 204 overlaid with wafer map 206.

The embodiments described herein may be configured for design analysis for "true" automatic defect classification (ADC). Such design analysis may include combining image analysis (e.g., bright field (BF), dark field (DF), tilt, etc.), layout, and design and/or process information to perform true ADC. Design analysis may also include secondary analysis such as EDX, FIB, etc.

In one embodiment, the method includes altering one or more parameters of at least one of the two or more inspection systems based on results of the defect review. For example, as shown in FIG. 5, the systematic defect review module may be configured for generating system feedback 210 to inspection, design, reticle, photo (lithography), or some combination thereof (as shown by arrow 212 in FIG. 5). The embodiments may also include optimization of a systematic defect inspection system using a systematic defect review system. For example, the embodiments may include inspection system (e.g., design inspection system, reticle inspection system, etc.) calibration. In such embodiments, results of DDR may be made available to the original systematic defect inspection system. For each of the defects, the embodiments may provide the user with the inspection system parameters and the review results to enable fine tuning and/or calibration of the inspection systems.

Figure 11:
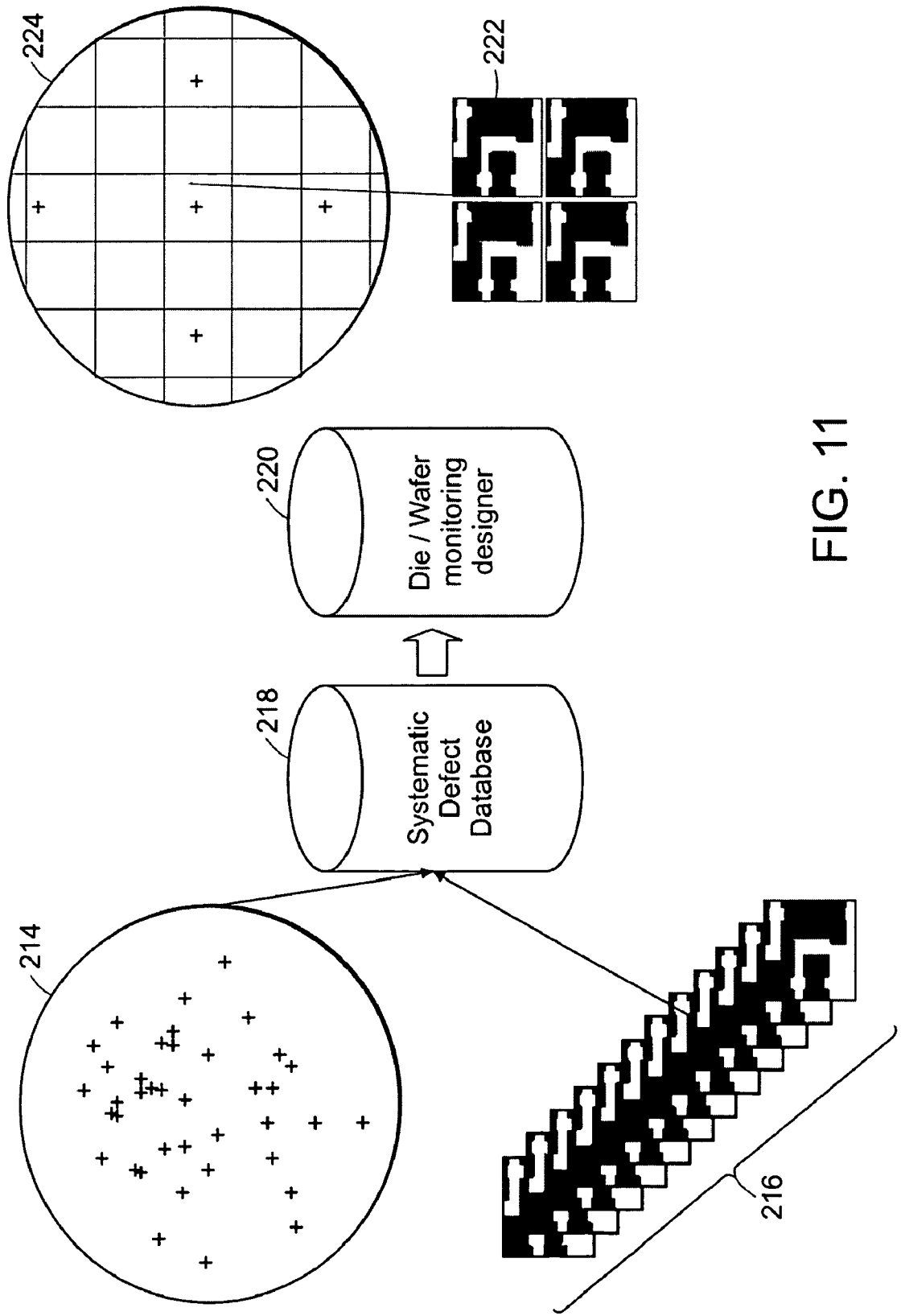
FIG. 11 is a schematic diagram illustrating one embodiment of steps that may be included in embodiments of a computer-implemented method for determining locations on a wafer to be reviewed during defect review.

One example of system feedback that may be generated by the embodiments described herein is illustrated in FIG. 11. As shown in FIG. 11, the system feedback may include a wafer map such as wafer map 214 shown in FIG. 11. This wafer map may be generated from a KLARF and may illustrate only defects detected by DDR. In addition, such system feedback may include also include design clips 216 showing the portion of the design in which the defects detected by DDR are located.

The embodiments may include sample design for systematic defect review and monitoring. For example, in one embodiment, the method includes storing information about the defects detected by the two or more inspection systems and results of the defect review in a database for systematic defects. In this manner, the embodiments may include creating a systematic defect data structure such as a database. In one such example, the system feedback shown in FIG. 11 may be used to create systematic defect database 218 shown in FIG. 11. The database may contain all of the information related to any systematic defect detected on any device, at anytime. This information may include design, process window, and wafer location for the systematic defects combined into a single data structure that may also include all of the design hot spots, reticle defects and contamination, etc.

The embodiments configured for sample design for systematic defect review and monitoring may also or alternatively be configured for monitoring vehicle creation. For example, in one embodiment, the method includes using information about the defects detected by the two or more inspection systems and results of the defect review to generate a design for a test object. In one such embodiment, the design includes all designs that can be used for monitoring a process performed on the wafer. For example, the above-described data structure may be used to generate an elaborated design of test structures and/or wafers containing all of the relevant designs required to monitor a specific process. In one such example, as shown in FIG. 11, systematic defect database 218 generated as described above may be provided to die and/or wafer monitoring designer or module 220. The systematic defect database may be used by the die and/or wafer monitoring designer or module to create new test structures. For example, the relatively large amount of information that is available or can be generated as described herein may be used to determine which types of designs are most problematic. These problematic types of designs may then be used to create a new test structure or a new test wafer. The test structure or test wafer may include different designs for different processes and may be used to create a new reticle that can be used to print the test structures or the test wafer. One example of a test structure may include test structures generated from ADS clips 222 shown in FIG. 11. The test structures may be positioned at the cross hatches shown in wafer map 224 in FIG. 11. The information for the test structures may also include die location, die design, sample, and process window parameters.

In one embodiment, the method includes using information about the defects detected by the two or more inspection systems and results of the defect review to generate a design for a test structure configured to be monitored for systematic defects and to add the design to a design to be printed on product wafers. The test structure may include the most critical design. For example, such a test structure may be added to an existing product wafer to enable efficient monitoring of systematic defects.

In another embodiment, the method includes using information about the defects detected by the two or more inspection systems and results of the defect review to generate a design for a monitor wafer configured to be monitored for systematic defects after processing of the monitor wafer with product wafers, and the design includes critical designs for the product wafers and variations of the critical designs corresponding to process windows for the critical designs. The wafers may include one or more monitoring wafers. For example, the monitoring wafers may be a full wafer that includes the most critical design and some variations around the process window corresponding to the most critical design that will be monitored. The monitoring wafer(s) may be processed together with the remaining product wafers and used to efficiently monitor all possible systematic defects, but also potential random defects. Such processing may be used to prevent the need to inspect and/or review the product wafers as performed traditionally.

The embodiments described herein may also include GDS-based sampling, classification, and normalization on a defect review system. As described above, the embodiments described herein may be configured to use the locations on the wafer to be reviewed during defect review determined as described herein in combination with results of wafer inspection. For example, as described further herein, systematic defects detected by wafer inspection may be added to the systematic defect sample created based on non-wafer processing defects and/or the wafer inspection results may be used to create a random defect sample, which may be reviewed separately and/or at the same time as the systematic defect sample. The results of the wafer inspection that may be used in the embodiments described herein may have any suitable format. For example, the results of the wafer inspection may include lot results, which may include any information about the defects detected on the wafer such as patch images, and standard file formats such as a KLARF file. The wafer inspection system may include any suitable wafer inspection system such as a BF wafer inspection system, a DF wafer inspection system, and an electron beam inspection (EBI) system. As described further herein, the embodiments may include removing defects such as defects located in dummy areas of the design ("dummy defects") and nuisance defects from the sampling plan. In addition, as described further herein, the embodiments may include combining DDR use cases with traditional SEM review. The embodiments advantageously can be used to improve SEM review efficiency. In addition, as described further herein, the embodiments may include normalizing a SEM Pareto after SEM review.

In one embodiment, in which the results of wafer inspection are used in combination with the determined locations on the wafer to be reviewed during defect review to generate a final defect review sample, design-based classification (DBC) is used to monitor known systematic patterns for real or nuisance defects. For example, the method may include extracting design clips for defects detected on the wafer. Extracting the design clips may be performed as described in the above-referenced patent applications by Kulkarni et al. and Zafar et al. The extracted design clips for the detected defects may be compared to a data structure that includes design clips for patterns of interest (POI). The data structure may be referred to as a DBC library, and the POI may be defined by a user. In this manner, the DBC library may include different POI associated with different DBC bins. The method may include comparing the design clips extracted for the defects detected on the wafer to the design clips in the DBC library. Results of the comparison may be used to assign DBC bins to the defects detected on the wafer. For example, if an extracted design clip matches a design clip in the DBC library, the defect for which the design clip was extracted may be assigned the DBC bin corresponding to the matching design clip in the DBC library. If the extracted design clip does not match any of the design clips in the DBC library, the defect for which the design clip was extracted may be assigned a DBC bin corresponding to an empty GDS clip (or a dummy filter) since the design clip does not correspond to any of the POI in the DBC library. Such defects may then be filtered from the defect population prior to sampling of the defect population. DBC may be further performed as described in the above-referenced patent applications by Kulkarni et al. and Zafar et al.

In some embodiments, the method includes prioritizing defects detected on a wafer by defect criticality index (DCI) determined for the defects. The prioritized defects may be used to improve the review sample. DCI for defects may be determined as a function of complexity of the pattern in which the defects are detected and the size of the defects. More specifically, as the complexity of the pattern increases, the DCI of the defect increases. In addition, as the size of the defect increases, the DCI of the defect increases. In this manner, relatively small defects located in relatively simple patterns may be assigned the lowest DCI while relatively large defects located in relatively complex patterns may be assigned the highest DCI. As such, the DCI value assigned to a defect may reflect the potential yield impact that a defect will have on a device. Every defect may be assigned one index at the end of wafer inspection. The DCI may have a value between 0 and 1. A DCI of 0 corresponds to a defect that has no yield impact, while a DCI of 1 corresponds to a defect that has high yield impact. In addition, if the defect is located in a dummy area of a design, the defect may be assigned no DCI number. The DCI for defects may be further determined and used to prioritize defects as described in the above-referenced patent applications to Kulkarni et al. and Zafar et al.

GDS-based sampling may be performed using results of wafer inspection. For example, instead of randomly sampling defects in wafer inspection results as is currently performed, prior knowledge such as results of reticle inspection, results of imaging of the reticle (e.g., results of aerial imaging of the reticle using a sensor disposed in an exposure system such as that described in the above-referenced patent application to Kekare et al.), GDS clips, and other information as described herein may be used to create a sampling plan to cover both "systematic defects" and "random defects." Input used for creating the sampling plan may be KLARF or a lot result from any wafer inspection systems such as those described further herein.

In preparation for the sampling plan, the method may include performing DBC to bin out systematic defect or nuisance. Performing DBC will also remove defects that fall on dummy fill structures or known non-POI. In this manner, preparation for a sampling plan may include binning out "dummy fill" defects by DBC and binning out defects in known non-POI. Binning out dummy fill defects may remove a substantial number of the defects in a population prior to sampling the defect population. Removing such defects prior to sampling is advantageous since the user generally does not care about such defects and such defects have no affect on yield. In addition, preparation for the sample plan may include identifying defects located within a known POI. Identifying the defects within a known POI may be performed using a data structure created as described herein, which may be configured as a library of POI generated by DDR.

The method may also include determining a DCI for the remaining defects using a 5 $\mu m \times 5$ $\mu m$ clip size. In addition, the method may include grouping the remaining defects based on the DCI determined for the defects. For instance, the remaining defects may be grouped into 10 different DCI groups (e.g., one group having DCI values from 0.1 to 0.2, another group having DCI values from 0.2 to 0.3, etc.). The DCI values determined and used in the steps described above may be DCI values determined using information acquired for the defects at low resolution. Therefore, such DCI values may be conveniently referred to as "low resolution DCI."

The method may also include creating a sample plan for both systematic defects and random defects. In particular, a sample plan for systematic defects may be created using the DBC bins, which is a DDR use case. In addition, a sample plan for random defects may be created using the DCI groups, which more resembles a traditional SEM review use case. In general, a substantial portion of the defects included in any defect population detected by wafer inspection will be defects having low DCI values. Since these defects have little or no effect on yield, reviewing such defects will decrease the yield relevancy of the defect review results. Therefore, in some embodiments, sampling defects for defect review based on the DCI groups may include sampling few if any defects from the group of defects corresponding to the lowest DCI values.

One embodiment for creating a SEM review sample plan may, therefore, include acquiring results of wafer inspection such as a KLARF. Creating the sample plan may also include using DBC and DCI to create DBC bins and DCI groups, which may be used to separate systematic defects from random defects. As described further herein, the DCI groups and DBC bins may be used as the basis for normalization. In addition, creating the sample plan may include sampling the same number of defects from each critical DBC bin. For example, creating the sample plan may include sampling one defect each from critical DBC bins. Creating the sample plan may also include sampling a number of defects from each DCI group. The sampled defects may then be sent to a defect review system for review.

A user may also select one or more parameters of DBB sampling used to create the sampling plan. For example, a user may select the maximum number of defects to be sampled. The user may also select results of the classification and/or grouping of defects from which defects are to be sampled. For example, the user may select whether or not defects are to be sampled from DBC results, DBG systematic results, DBG random results, or some combination thereof. For each set of results, the user may also select one or more parameters for sampling. For example, for sampling from DBC results, the user may select the sample size (e.g., 5), the filter (e.g., SEM non visual), the bin priorities (e.g., count), and the within bin sampling scheme (e.g., random). For sampling from DBG systematic results, the user may select the sample size (e.g., 10), the bin priorities (e.g., random), and the within bin sampling scheme (e.g., prioritized by defect size). In addition, for sampling from DBG random results, the user may select the within bin sampling scheme (e.g., prioritized by defect size). The user may make such selections using any suitable user interface having any suitable configuration.

In the same or a different user interface, the user may select one or more parameters for sampling within individual bins or groups. For example, a user interface may be configured to display a table containing a column that lists categories of groups or bins (e.g., DBG group, DBC bin, DBB manual bin, rough super group, and fine class). The user may select to show individual groups or bins within each category in the column (by expanding or collapsing the list of individual groups or bins in each category). The user can select parameters for sampling for each category collectively or for each bin or group within the categories independently. For example, the user may select to show individual DBC bins in the column such that parameters for sampling from each individual DBC bin can be selected separately in the table. In addition, the user may select to show individual bins resulting from DBB manual binning in the column, which may be displayed by rough code, such that parameters for sampling from each individual DBB manual bin can be selected separately.

A number of additional columns may also be displayed in the table. One column may include buttons for different actions (e.g., new or delete) that a user may select for each category, individual bin, or individual group shown. Another column may include codes for each category, individual bin, or individual group shown. For categories, this column may allow the user to select all nonzero groups or bins within the categories. For individual bins or groups shown in the table, this column may show the code assigned to each individual bin or group. The table may also include a column that allows the user to enter the number or percentage of defects to be selected from each category, individual bin, or individual group and another column that allows the user to specify whether the defects to be selected is number of defects or percentage of defects. In addition, the table may include a column that allows the user to select a within bin sampling scheme (e.g., random, prioritized by defect size, prioritized by pattern density, etc.). The table may also allow a user to select the maximum number of code defects to be sampled. This user interface may also have any suitable configuration known in the art.

After SEM review, the method may include performing GDS-based classification for every reviewed defect. GDS-based classification may include aligning a SEM image with GDS to remove any "coordinate error." GDS-based classification may also include using a 0.5 µm by 0.5 µm clip size to recalculate the DCI (a "high-resolution DCI"). GDS-based classification may further include automatically classifying defects into one of a number of categories. For example, the categories may include, for example purposes only, array-pattern-failure, array-big-particle, array-medium-particle, array-small-particle, non-array-pattern-failure, non-array-big-particle, non-array-medium-particle, and non-array-small particle. After GDS-based classification, every reviewed defect may belong to one known category, may have one "high-resolution DCI value," and may belong to one DCI group. For example, if the DCI value is 0.75, the defect belongs to DCI group 8 (the group for defects having DCI values between 0.7 and 0.8).

GDS-based classification would use a combination of data extracted from one or more SEM images of the defect location as well as design information at the location of the defect. Although this mentions GDS-based classification, the design information used for this classification may include additional data such as electrical net lists or film thickness information. The GDS-based classification methodology may include using data such as whether a defect is a pattern or foreign material type defect, whether the defect is bump or a depression, and whether the defect affects non-dummy patterns on the wafer.

GDS-based classification of defects performed on defect review systems has a number of advantages. For example, such classification can eliminate or reduce the need for manual classification of defects. Eliminating or reducing manual classification can reduce human error during classification. In addition, a normalized defect review Pareto may be used to drive SPC control. In this manner, systematic and random excursions may be detected faster. Furthermore, GDS-based classification can provide "rough CD" and "kill probability" of every reviewed defect. An additional use of the GDS-based classification is that the defect classification can then drive additional actions at that or other defect locations. One example of this might be doing material analysis on a defect found to be a fall-on particle. Another example might be to do additional process window characterization by measuring the same defect location on multiple dies on the wafer if the defect is classified as a pattern defect at a known design hotspot.

CD and other characteristics of defects can be determined using output of the defect review system in combination with output and/or information about intentional defect array (IDA) wafers developed by the International SEMATECH Manufacturing Initiative (ISMI), which is a wholly owned subsidiary of SEMATECH, Austin, Tex. For example, IDA wafers for the poly gate level may include 45 nm lines with defects having sizes from about 150 nm to about 15 nm with greater than about 75% of defects printed. IDA wafers for the metal 1 trench level may include 65 nm lines with defects having sizes from about 170 nm to about 17 nm with greater than about 80% of defects printed. The intentional defect types may include, for example, center island, bridge in x axis, bridge in y axis, line end extension in x axis, line end extension in y axis, inside corner extension, missing structure, misplacement in x axis, misplacement in y axis, bias (−50% to +200%), outside corner extension, center intrusion, edge intrusion in x axis, and line center intrusion. The defects may be sized across a range from 200% of the design rule to 25% of the design rule. A cell containing a defect is placed in the center of an array of cells that forms a block of the defective die structure. A defect-containing die is constructed with a two-dimensional array of blocks. The blocks contain defective cells that decrease in size from 200% to 25% of the design rule across one dimension of the array. Different defect types may be found in different blocks across the other dimension of the array. Further description of IDA wafers can be found in "Abstract for: Intentional Defect Arrays for 65 nm Technology and Beyond" by International SEMATECH, Oct. 5, 2005, which is incorporated by reference as if fully set forth herein. Output for one or more IDA wafers may be acquired using the defect review system, and the output for the IDA wafer(s) may be used in combination with output acquired by the defect review system for defects on another wafer to normalize the CD and other characteristics of the defects to the defects on the IDA wafers.

GDS-based normalization may include normalizing a Pareto generated by defect review through DCI groups (e.g., DCI groups including a group for defects having DCI values from 0 to 0.1, a group for defects having DCI values from 0.1 to 0.2, etc.). GDS-based normalization may also be performed for DBC bins that include systematic defects. In addition. GDS-based normalization may be performed for DCI groups, which may include random defects. The following steps may be performed to normalize a defect Pareto for DCI groups. The DCI group of reviewed defects may be used to link to the total defect population and normalize the defect review Pareto. The defect density, D0, may then be determined. In one such example, a number (e.g., 10) of the defects or a percentage of the defects may be sampled from each DCI group. The sampled defects may be reviewed and classified by defect type (e.g., pattern failure, big particle, medium particle, small particle, etc.), and the number of each type of defect in each DCI group may be determined. The number of each type of defect determined by review in each DCI group and the total number of defects in each DCI group may then be used to normalize the defect review Pareto.

A normalized defect Pareto may show the numbers of defects as a function of defect type. For example, the number of poly embed defects on a wafer may be shown in the Pareto separately from the number of particle type defects on the wafer, both of which may be shown separately from the number of residue type defects on the wafer. In addition, the numbers of the different types of defects detected on different wafers may be shown in the Pareto chart. Furthermore, since the numbers of the different types of defects detected on different wafers are normalized, the numbers of the different types of defects detected on different wafers may be directly compared to each other. In this manner, an excursion in a process may be detected relatively accurately using such a Pareto chart.

GDS-based normalization has a number of advantages. For example, currently normalization is performed by a user of the defect review system, which is disadvantageous for a number of obvious reasons. In addition, GDS-based normalization allows a wafer-level yield prediction from a normalized SEM review Pareto, which provides significant value. In addition, a yield or defect team can determine and take action(s) based on the normalized Pareto.

Any of the methods described herein may include storing results of one or more steps of one or more methods described herein in a storage medium. The results may include any of the results described herein. The results may be stored in any manner known in the art. In addition, the storage medium may include any storage medium described herein or any other suitable storage medium known in the art. After the results have been stored, the results can be accessed in the storage medium and used by any of the method or system embodiments described herein or any other method or system. Furthermore, the results may be stored "permanently," "semi-permanently," temporarily, or for some period of time. For example, the storage medium may be random access memory (RAM), and the results may not necessarily persist in the storage medium. Each of the embodiments of the method described above may include any other step(s) of any other method(s) described herein. In addition, each of the embodiments of the method described above may be performed by any of the systems described herein.

Figure 12:
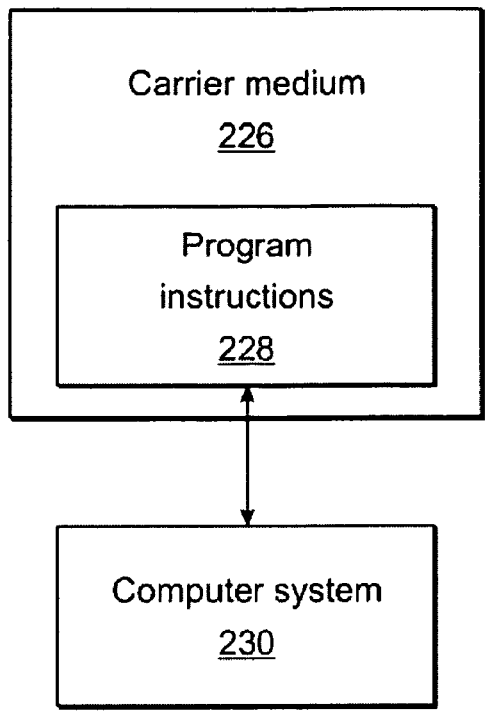
FIG. 12 is a block diagram illustrating one embodiment of a carrier medium that includes program instructions executable on a computer system for performing a computer-implemented method for determining locations on a wafer to be reviewed during defect review.

Another embodiment relates to a carrier medium that includes program instructions executable on a computer system for performing a computer-implemented method for determining locations on a wafer to be reviewed during defect review. One such embodiment is illustrated in FIG. 12. In particular, as shown in FIG. 12, carrier medium 226 includes program instructions 228 executable on computer system 230. The computer-implemented method includes acquiring coordinates of defects detected by two or more inspection systems. Acquiring the coordinates of the defects may be performed according to any of the embodiments described herein. The defects do not include defects detected on the wafer. The defects may include any of the defects described herein, and the two or more inspection systems may include any of the inspection systems described herein.

The computer-implemented method also includes determining coordinates of the locations on the wafer to be reviewed during the defect review by translating the coordinates of the defects into the coordinates on the wafer such that results of the defect review performed at the locations can be used to determine if the defects cause systematic defects on the wafer. Determining the coordinates of the locations on the wafer to be reviewed may be performed according to any of the embodiments described herein. The computer-implemented method(s) may include performing any other step(s) of any other embodiment(s) described herein.

Program instructions 228 implementing methods such as those described herein may be transmitted over or stored on carrier medium 226. The carrier medium may be a transmission medium such as a wire, cable, or wireless transmission link. The carrier medium may also be a storage medium such as a read-only memory, a random access memory, a magnetic or optical disk, or a magnetic tape.

Computer system 230 may take various forms, including a personal computer system, mainframe computer system, workstation, image computer, parallel processor, or any other device known in the art. In general, the term "computer system" may be broadly defined to encompass any device having one or more processors, which executes instructions from a memory medium.

Figure 13:
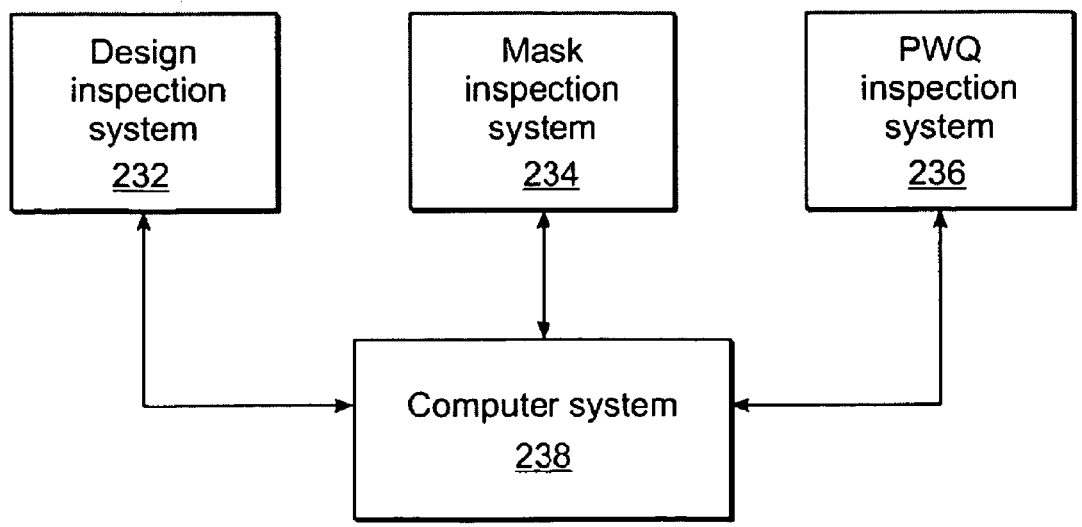
FIG. 13 is a block diagram illustrating one embodiment of a system configured to determine locations on a wafer to be reviewed during defect review.

An additional embodiment relates to a system configured to determine locations on a wafer to be reviewed during defect review. One embodiment of such a system is shown in FIG. 13. The system includes two or more inspection systems configured to detect defects. The defects do not include defects detected on the wafer. For example, as shown in FIG. 13, the system includes design inspection system 232, mask inspection system 234, and PWQ inspection system 236. The inspection systems may include any such inspection systems described herein. In addition, the defects detected by such inspection systems may include any of the defects described herein. Furthermore, although the embodiment shown in FIG. 13 includes three inspection systems, the system may include any two of the inspection systems shown in FIG. 13.

The system also includes computer system 238 coupled to the two or more inspection systems such that the computer system can acquire coordinates of the defects detected by the two or more inspection systems. The computer system may be coupled to the two or more inspection systems according to any of the embodiments described herein. The computer system is configured to determine coordinates of the locations on the wafer to be reviewed during the defect review by translating the coordinates of the defects into the coordinates on the wafer such that results of the defect review performed at the locations can be used to determine if the defects cause systematic defects on the wafer. The computer system may be configured to determine the coordinates of the locations on the wafer according to any of the embodiments described herein. The computer system may be configured to perform any other step(s) of any other method(s) described herein. The system may be further configured according to any embodiment(s) described herein.

The computer system described above may be configured as a stand-alone system that does not form part of a process, inspection, metrology, review, or other tool. In such an embodiment, the computer system may be configured to receive and/or acquire data or information from other systems (e.g., inspection results from an inspection system) by a transmission medium that may include "wired" and/or "wireless" portions. In this manner, the transmission medium may serve as a data link between the computer system and the other system. In addition, the computer system may send data to the other system via the transmission medium. Such data may include, for example, results of the methods described herein, inspection recipes or other recipes, or some combination thereof. In other embodiments, however, the computer system is included in a defect review system. The defect review system may be configured as described herein.

Further modifications and alternative embodiments of various aspects of the invention may be apparent to those skilled in the art in view of this description. For example, methods, designs, defect review tools, and systems for determining locations on a wafer to be reviewed during defect review are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for determining locations on a wafer to be reviewed during defect review, comprising:
    acquiring coordinates of defects detected by two or more inspection systems, wherein the defects do not comprise defects detected on the wafer;
    determining coordinates of the locations on the wafer to be reviewed during the defect review by translating the coordinates of the defects into the coordinates on the wafer such that results of the defect review performed at the locations can be used to determine if the defects cause systematic defects on the wafer; and
    using information reference to the defects detected by the two or more inspection systems and results of the defect review to generate a design for a test structure configured to be monitored for systematic defects and to add the design to a design to be printed on product wafers.

2. The method of claim 1, wherein the defects comprise defects in a design, defects detected on a reticle, defects on the reticle detected by process window characterization, or some combination thereof, and wherein the two or more inspection systems comprise a design inspection system, a reticle inspection system, a process window characterization system, or some combination thereof.

3. The method of claim 1, wherein said determining comprises determining the coordinates of the locations on the wafer to be reviewed as a single set of coordinates.

4. The method of claim 1, further comprising creating a recipe for the defect review using the coordinates of the locations and a design for the wafer, wherein said creating is performed offline without imaging the wafer or defects on the wafer.

5. The method of claim 1, further comprising determining if systematic defects detected on the wafer by inspection of the wafer are correlated to the defects detected by the two or more inspection systems.

6. The method of claim 1, further comprising creating an encrypted and secured file comprising the coordinates of the locations on the wafer to be reviewed during the defect review.

7. The method of claim 1, further comprising identifying the locations on the wafer during the defect review by comparing images acquired during the defect review at the coordinates of the locations to a design for the wafer.

8. The method of claim 1, further comprising selecting a method for automatic defect location to be performed during the defect review from all available methods for the automatic defect location based on a design for the wafer.

9. The method of claim 1, further comprising identifying the locations on the wafer during the defect review by comparing images acquired during the defect review at the coordinates of the locations to a design for the wafer and simulated images that illustrate how the design for the wafer would be printed on the wafer at different values of one or more parameters of a process performed on the wafer.

10. The method of claim 9, further comprising determining information reference to the process based on results of said comparing.

11. The method of claim 1, further comprising determining, during the defect review, if additional locations on the wafer are to be reviewed based on results of the defect review at the locations and a design for the wafer proximate the locations.

12. The method of claim 1, further comprising determining, during the defect review, if an additional operation is to be performed at the locations on the wafer based on results of the defect review at the locations and a design for the wafer.

13. The method of claim 1, further comprising acquiring results of inspection of the wafer and randomly selecting defects detected by the inspection of the wafer from the results of the inspection for review during the defect review, wherein the locations on the wafer constitute a systematic defect sample, wherein the randomly selected defects constitute a random sample, and wherein the defect review for the systematic defect sample and the random sample is performed in the same defect review process.

14. The method of claim 13, wherein prior to the defect review, if analysis of the results of the inspection indicates that one or more of the defects detected by the inspection of the wafer are systematic defects, the method further comprises adding the one or more of the defects to the systematic defect sample and if the one or more of the defects are included in the random sample, removing the one or more of the defects from the random sample.

15. The method of claim 13, further comprising generating a Pareto chart illustrating results of the defect review of the systematic defect sample and the random sample.

16. The method of claim 13, further comprising classifying defects in the random sample identified by the defect review as systematic defects using design-based binning.

17. The method of claim 1, further comprising using results of the defect review to determine locations of the systematic defects on the wafer and using a design for the wafer to determine additional locations on the wafer at which the systematic defects can be found.

18. The method of claim 1, further comprising using results of the defect review to determine a kill ratio for defects found during the defect review by comparing the found defects to a design for the wafer and to determine a yield impact for the defects found during the defect review by comparing dimensions of the defects found during the defect review to dimensions of the design for the wafer.

19. The method of claim 1, further comprising altering one or more parameters of at least one of the two or more inspection systems based on results of the defect review.

20. The method of claim 1, further comprising storing information reference to the defects detected by the two or more inspection systems and results of the defect review in a database for systematic defects.

21. The method of claim 1, further comprising using information reference to the defects detected by the two or more inspection systems and results of the defect review to generate a design for a test object, wherein the design for the test object comprises all designs that can be used for monitoring a process performed on the wafer.

22. The method of claim 1, further comprising using information reference to the defects detected by the two or more inspection systems and results of the defect review to generate a design for a monitor wafer configured to be monitored for systematic defects after processing of the monitor wafer with product wafers, wherein the design for the monitor wafer comprises critical designs for the product wafers and variations of the critical designs corresponding to process windows for the critical designs.

23. A computer-readable storage medium, comprising program instructions executable on a computer system for performing a computer-implemented method for determining locations on a wafer to be reviewed during defect review, wherein the computer-implemented method comprises:

acquiring coordinates of defects detected by two or more inspection systems, wherein the defects do not comprise defects detected on the wafer;

determining coordinates of the locations on the wafer to be reviewed during the defect review by translating the coordinates of the defects into the coordinates on the wafer such that results of the defect review performed at the locations can be used to determine if the defects cause systematic defects on the wafer; and using information reference to the defects detected by the two or more inspection systems and results of the defect review to generate a design for a test structure configured to be monitored for systematic defects and to add the design to a design to be printed on product wafers.

24. A system configured to determine locations on a wafer to be reviewed during defect review, comprising:

two or more inspection systems configured to detect defects, wherein the defects do not comprise defects detected on the wafer; and a computer system coupled to the two or more inspection systems such that the computer system can acquire coordinates of the defects detected by the two or more inspection systems, wherein the computer system is configured to determine coordinates of the locations on the wafer to be reviewed during the defect review by translating the coordinates of the defects into the coordinates on the wafer such that results of the defect review performed at the locations can be used to determine if the defects cause systematic defects on the wafer, and wherein the computer system is further configured to use information reference to the defects detected by the two or more inspection systems and results of the defect review to generate a design for a test structure configured to be monitored for systematic defects and to add the design to a design to be printed on product wafers.

* * * * *